United States Patent
Aga et al.

(10) Patent No.: US 8,150,352 B1
(45) Date of Patent: Apr. 3, 2012

(54) FEEDBACK LNA WITH IMAGE FILTERING

(75) Inventors: Arshan Aga, Mountain View, CA (US); Farbod Aram, Los Altos Hills, CA (US)

(73) Assignee: Project FT, Inc., Mountain View, CA (US)

( * ) Notice: Subject to any disclaimer, the term of this patent is extended or adjusted under 35 U.S.C. 154(b) by 0 days.

(21) Appl. No.: 12/799,547

(22) Filed: Apr. 26, 2010

Related U.S. Application Data

(63) Continuation-in-part of application No. 12/231,169, filed on Aug. 29, 2008.

(60) Provisional application No. 61/215,069, filed on May 1, 2009.

(51) Int. Cl.
*H04B 1/06* (2006.01)

(52) U.S. Cl. ......... 455/266; 455/307; 455/318; 455/339

(58) Field of Classification Search .................. 455/285, 455/293, 266, 296, 302, 307, 314, 318, 323, 455/339, 340
See application file for complete search history.

(56) References Cited

U.S. PATENT DOCUMENTS

| | | | | |
|---|---|---|---|---|
| 5,220,688 | A * | 6/1993 | Tao ................................. | 455/314 |
| 2002/0160739 | A1* | 10/2002 | Ozeki et al. ..................... | 455/313 |
| 2004/0058660 | A1* | 3/2004 | Cowley et al. ................. | 455/302 |
| 2007/0093228 | A1* | 4/2007 | Bayruns ......................... | 455/293 |
| 2008/0248765 | A1* | 10/2008 | Gater ............................. | 455/101 |

* cited by examiner

*Primary Examiner* — Nguyen Vo
(74) *Attorney, Agent, or Firm* — Van Pelt, Yi & James LLP

(57) ABSTRACT

What is described herein is a technique that includes a clock generator configured to generate a clock signal having a frequency of $|f_{bp}+f_i|$. The technique further includes a mixer configured to input (1) an input signal that includes a desired signal at the frequency $f_i$ and (2) the clock signal and generate a mixed signal using the input signal and the clock signal. A filter, having a bandpass region that includes the frequency $f_{bp}$, is configured to input the mixed signal and generate a filtered signal based at least in part on the bandpass region.

20 Claims, 23 Drawing Sheets

FEEDBACK LNA WITH IMAGE FILTERING

CROSS REFERENCE TO OTHER APPLICATIONS

This application claims priority to U.S. Provisional Patent Application No. 61/215,069 entitled FEEDBACK LOW NOISE AMPLIFIER WITH IMAGE FILTERING filed May 1, 2009 which is incorporated herein by reference for all purposes.

This application is a continuation in part of co-pending U.S. patent application Ser. No. 12/231,169 entitled BROADBAND LNA WITH FILTER filed Aug. 29, 2008, which is incorporated herein by reference for all purposes.

BACKGROUND OF THE INVENTION

Filtering is an important aspect of many transceivers. In some systems a signal is received that has two components: a desired signal in a frequency band of interest and an undesired signal that occupies all other frequencies and may be much larger than the desired signal (sometimes referred to as "blockers"). When the desired signal is bandpass in nature (i.e., the frequency band it occupies has a center frequency larger than zero and has a bandwidth less than twice the center frequency) it is sometimes necessary to create a sharp filter that attenuates the blockers while maintaining the integrity of the desired signal. Furthermore, often times programmability is also desirable since the transceiver may be required to operate on various input signals in various frequency bands. Building a filter with a sharp cut-off that is widely programmable is very difficult. One technique that is often used is to build a filter at a specific (i.e., fixed) frequency or a filter that covers a relatively small range of frequencies and use a mixer to translate the desired signal from its frequency band to the center frequency of the filter.

One major issue that occurs in this process of mixing is that the clock used in mixing is composed of a fundamental frequency as well as its harmonics. These harmonics can cause lots of problems including translating undesirable information directly on top of desirable information. It would be desirable to develop techniques that minimize this issue.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
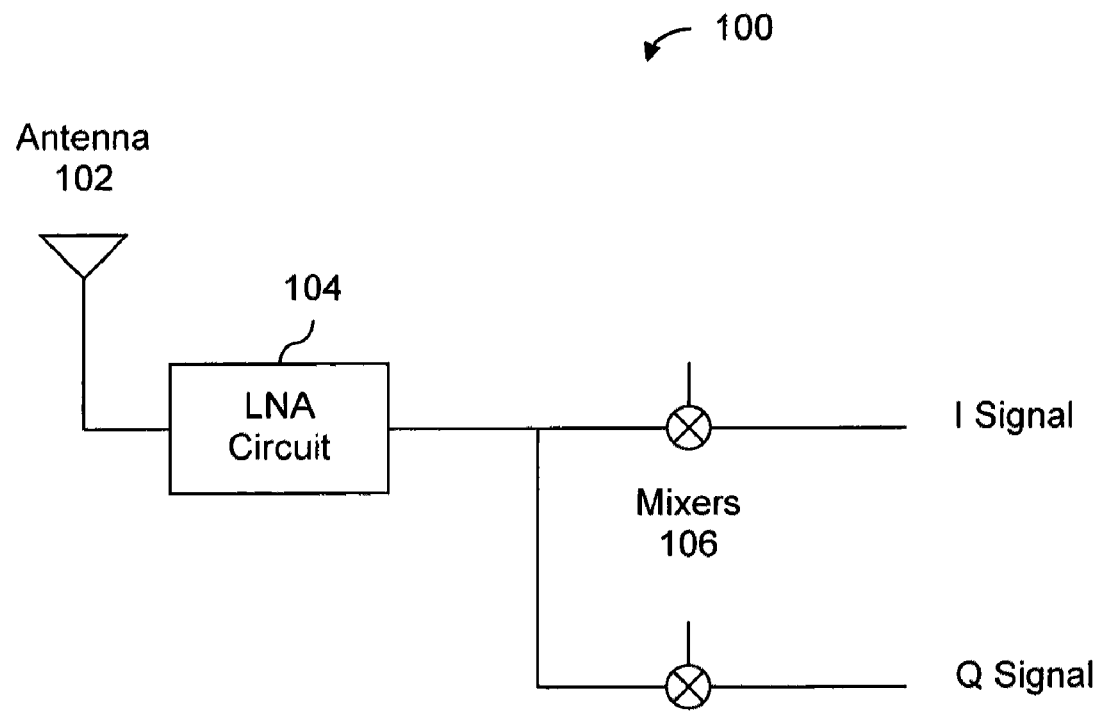
FIG. 1 is a system diagram illustrating an embodiment of a front end receiver.

FIG. 1 is a system diagram illustrating an embodiment of a front end receiver. In the example shown, front end receiver 100 shows the receive path of a wireless transceiver. A signal is received via antenna 102 and is passed to low noise amplifier (LNA) circuit 104. In some embodiments described herein, LNA circuit 104 includes a feedback LNA with a resistor. After amplification by LNA circuit 104, the amplified signal is passed to mixers 106, one of which outputs an I signal and the other of which outputs a Q signal. In this example, LNA circuit 104 outputs a current and passes the (amplified) current to mixers 106. Mixers 106 are current commuting mixers, such as a Gilbert multiplier.

In various embodiments, a variety of subsequent processing (e.g., I/Q correction, analog to digital conversion, etc.) is then performed. Front end receiver 100 is one example of a front end receiver and in other embodiments is configured differently (e.g., with different components and/or connections).

In various embodiments, LNA circuit 104 is configured to perform certain functions and/or have certain properties or attributes. In one example, LNA circuit 104 is impedance matched to antenna 102 so that the input resistance (Rin) of LNA circuit 104 is designed or configured to be 50Ω. In some cases, the input resistance varies with frequency and Rin is 50Ω at a frequency (range) of interest. In some embodiments, LNA circuit 104 is configured to have an overall gain from the input to output of LNA. In some cases, the overall gain is on the order of 10 to 20 dB. In some embodiments, LNA circuit 104 is configured to have low noise (e.g., on the order of 2 dB) and have good linearity.

In various embodiments, front end receiver is used in various applications. In one example, front end receiver 100 used in a software defined radio application. For example, the I and Q signals output by front end receiver 100 (in some embodiments after analog to digital conversion) are passed to a software interface where subsequent processing is performed on the signals using software (e.g., as opposed to specially designed application specific integrated circuits (ASICs), field programmable gate arrays (FPGAs), or other hardware). Based on the frequency (range) of interest, front end receiver 100 is configured accordingly. For example, in GSM a channel is 200 KHz wide, in W-CDMA a channel is 3.8 MHz wide, and in LTE a channel is 20 MHz wide with various center frequencies.

Figure 2:
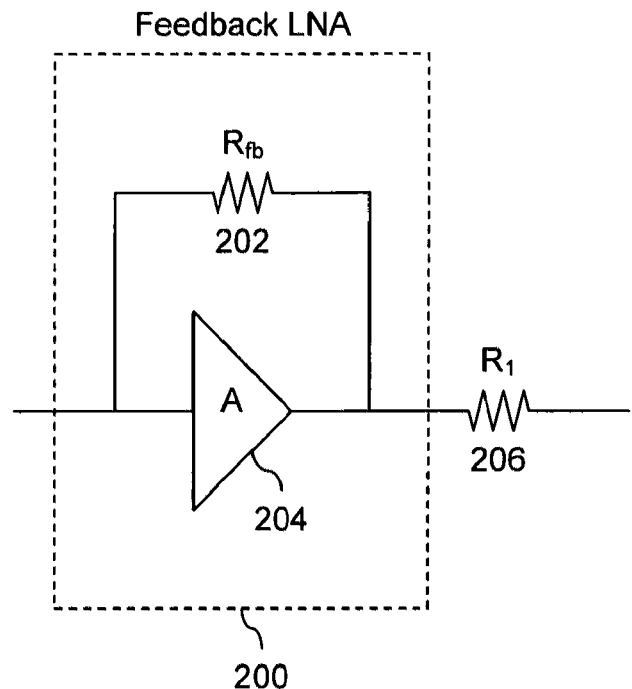
FIG. 2 is a diagram illustrating an embodiment of an LNA circuit that includes a feedback LNA and a resistor.
Figure 2:
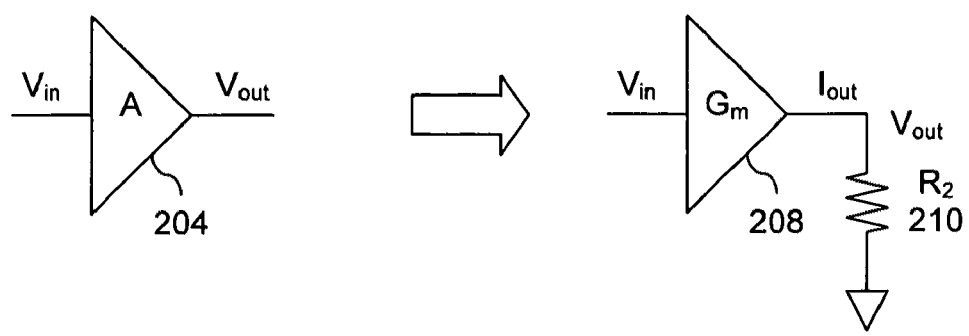

FIG. 2 is a diagram illustrating an embodiment of an LNA circuit that includes a feedback LNA and a resistor. In this example, LNA circuit 104 of FIG. 1 is implemented as shown. In some other embodiments, LNA circuit 104 is implemented differently. In this example of LNA circuit 104, the output of feedback LNA 200 is connected in series to resistor R1 (206). In some embodiments, the value of R1 is approximately 500Ω-1 kΩ. Feedback LNA 200 includes gain element 204 and resistor 202. In various embodiments, gain element 204 is implemented as an op amp, with transistors, etc. The input of feedback LNA 200 is formed by connecting the input of gain element 204 and one end of resistor 202. The output of feedback LNA 200 is formed by connecting the other end of resistor 202 and the output of gain element 204. Gain element 204 has a broadband gain of A and resistor 202 has a resistance of Rfb. In some embodiments, resistor 202 has a value within the range of 500Ω-8 kΩ. Resistor 202 is sometimes referred to as a feedback resistor since it is in the feedback path. As used herein, a feedback LNA refers to any LNA that includes a feedback path.

Resistor 206 converts a voltage (which is output by feedback LNA 200) from a voltage to a current. The current output by LNA circuit 104 is (for example) passed on to a mixer (e.g., mixers 106 in FIG. 1). In some cases, resistor 206 or similar resistors are referred to as conversion resistors since this resistor converts a voltage to a current.

In some embodiments, some or all of the components included in LNA circuit 104 are adjustable. For example, the value of resistor 202 (Rfb) in some configurations is adjustable. Similarly, in some embodiments, the gain (A) of gain element 204 and/or resistor 206 is/are adjustable. In some embodiments, this allows a frequency of interest to be changed and/or for some or all parameters to be adjusted as desired (e.g., Rin, overall gain, noise, linearity, etc.).

Gain element 204 can conceptually be broken into or represent by two parts: a transconductor Gm (208), the output of which is coupled to the input of a resistor R2 (210). This is shown in FIG. 2. Gain element 204 has a voltage in (Vin) and a voltage out (Vout) whereas transconductor 208 has a voltage in (Vin) and a current out (Iout). The current output by transconductor 208 passes through resistor 210, creating an output voltage (Vout).

Any LNA circuit has various parameters which are of interest to circuit designers. The particular parameters of interest and/or desired parameter values vary from application to application. Some parameters of feedback LNA 200 are described in further detail below.

The input resistance (Rin) of feedback LNA 200 is given by the equation: $Rin=Rfb/A+1/Gm$. In some applications (including this example), the input resistance is dominated by $Rfb/A$ (as opposed to $1/Gm$) and $Rin \approx Rfb/A$. In some other applications this is not the case and the appropriate equation for Rin is used depending upon the situation. In some embodiments, the input resistance is set to a value of 50Ω to match the impedance of the antenna (e.g., antenna 102 in FIG. 1). In some other embodiments, the input resistance is set to some other value.

The noise of feedback LNA 200 is proportional to $1/Gm$. The noise of LNA circuit 104 shown in this figure is $R1/A$. In some embodiments, a desired noise ceiling is selected and the value of R1 and/or A is set accordingly. In one example, a desired noise ceiling is around 2 dB.

The overall gain (Vout/Iin) of feedback LNA 200 is approximated by $Vout/Iin \approx Rib$, where Iin is a current at the input of feedback LNA 200 and Vout is the voltage at the output of feedback LNA 200.

The output resistance (Rout) of feedback LNA is given by $Rout=1/Gm$ at low frequencies and approaches the feedback resistance (Rfb) at high frequencies.

Inspection of the parameter equations described above reveals that as the resistance of Rfb increases, the gain of the feedback LNA (i.e., Vout/Iin) increases. Another parameter that also increases with Rfb is Rin (which is undesirable). The input resistance (Rin) should be 50Ω to match the antenna impedance. To counteract this and keep the input impedance Rin at 50Ω (or alternatively whatever Rin is desired), A is correspondingly increased (e.g., at the same rate) to keep Rin at a desirable value while still increasing Vout/Iin.

An attractive feature about the feedback LNA and resistor combination shown in this figure is that parameters (e.g., Rin, overall gain Vout/Iin, noise, etc.) can be set relatively easily without adversely affecting another parameter. Some other LNA circuits do not necessary have this ability and it can be difficult to optimize multiple parameters.

Another attractive feature of the example circuit shown is that power consumption can be controlled. The amount of current passing through the circuit (and thus the power consumed) is dependent upon the value of R1 (resistor 206).

Another attractive feature about the circuit shown in this figure is that all or almost all of the components are passive. Other less attractive components such as transconductors are not used. Some other LNA circuits use a transconductor to do the voltage to current conversion (e.g., instead of resistor 206). One benefit to using resistor 206 (e.g., compared to a transconductor) is that a resistor has better linearity performance. This is particularly attractive for applications where there are large swings in the signal in which linearity performance is more important. Resistor 206 is also desirable because no DC current is required for biasing (as compared to a transconductor) which reduces power consumption.

In some embodiments, a system includes components in addition to those shown in this example. For example, some configurations include a bypass capacitor in series with mixer R1 (i.e., resistor 206).

Some other LNA circuits use on-chip inductors to perform impedance matching (e.g., to the resistance of an antenna). LNA circuit 104 is able to perform impedance matching without the use of on chip inductors which is attractive in certain applications. Using inductors in an LNA circuit "hard codes" the circuit to a particular frequency (range) of interest and the circuit cannot be reconfigured for other frequencies of interest. For example, an LNA would include small inductors for high frequency applications whereas large inductors would be used for low frequency applications. In some applications (e.g., in software defined-radio) this is unattractive.

Feedback LNA 200 helps the linearity of a receiver which includes it (e.g., front end receiver 100 from FIG. 1) by mitigating non-linearity issues in a subsequent mixer (e.g., mixers 106 in FIG. 1). For example, using the Third Order Input Intercept Point (IIP3) as a measurement, using a feedback LNA increases the IIP3 value.

Other circuit designers have avoided using a resistor in series with an LNA (any LNA, not necessarily a feedback LNA) because of certain issues. A conversion resistor can cause certain LNA circuits to not operate as desired. A conversion resistor can load some existing LNA circuits, which reduces the gain (in some cases quite significantly). A conversion resistor also reduces the amount of rejection to a single transistor (as opposed to at least two transistors if a transconductor is used to do the voltage to current conversion). For example, with a resistor between some types of LNAs and a mixer, some noise from the oscillator connected to the mixer will feed back through the conversion resistor to the LNA. In general, an LNA with a high output impedance will not work with a conversion resistor. These issues do not occur with a transconductor to do the voltage to current conversion and therefore other circuits use a transconductor to do the voltage to current conversion.

Feedback LNA 200 in series with conversion resistor 206 does not have the issues described above. Feedback LNA 200 has a relatively small output impedance compared to some other LNA circuits and will work with a conversion resistor. Also, as shown by the equation for overall gain (Vout/Iin) above, the gain can be set to acceptable levels. A conversion resistor is a passive component and the linearity properties are quite good. Optimizing the linearity of feedback LNA 200 and/or a subsequent mixer can then be focused on without having to worry about the linearity of resistor 206.

Figure 3:
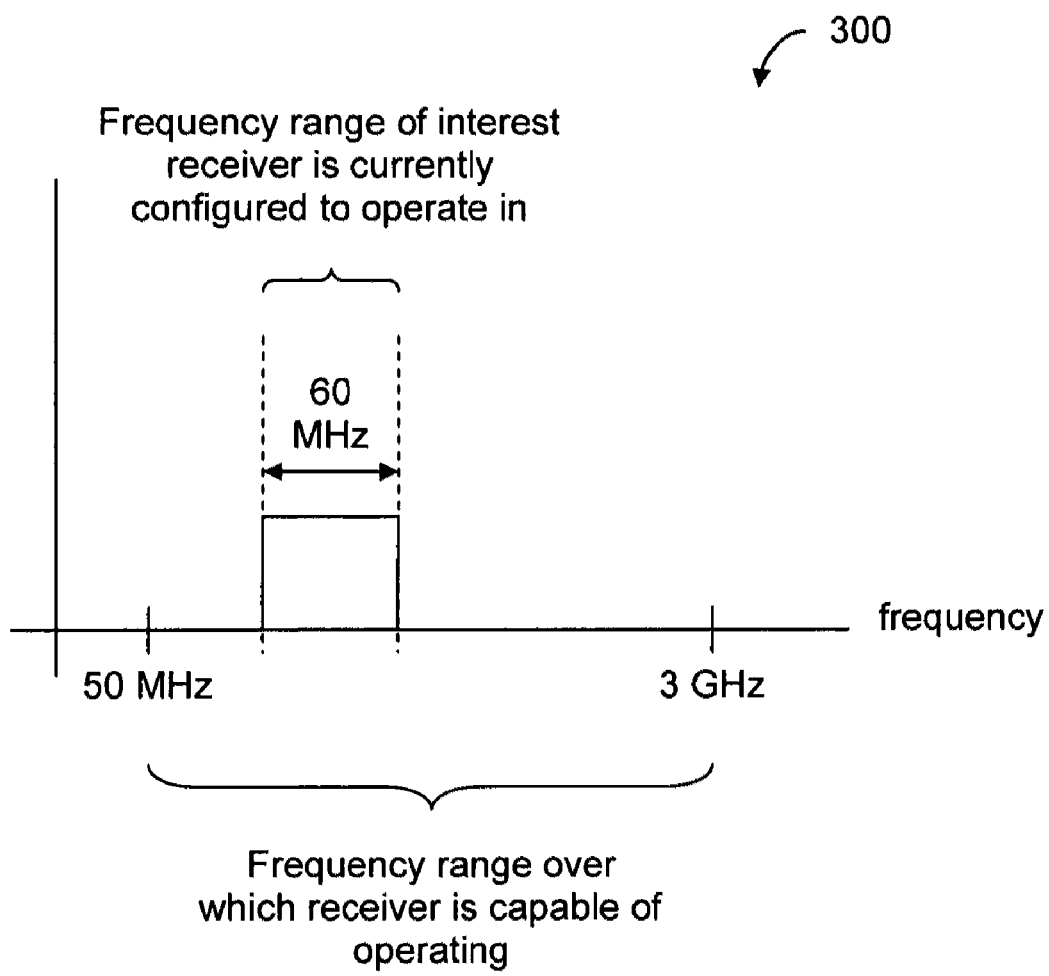
FIG. 3 is a frequency spectrum illustrating an example of a broadband application.

FIG. 3 is a frequency spectrum illustrating an example of a broadband application. In some embodiments, a receiver (e.g., LNA circuit 104 shown in FIG. 2) is a broadband circuit. As used herein, the term broadband refers to a relatively wide operating frequency range. In frequency spectrum 300, the range over which the receiver is capable of operating is from 50 MHz to 3 GHz. The term broadband does not necessarily mean that a device operates in the entire possible range at the same time. In this particular example, the receiver is currently configured to operate in a 60 MHz wide band within 50 MHz to 3 GHz. In some embodiments, a broadband receiver is configurable (e.g., so that the width and/or positioning of a frequency range of interest can be adjusted as desired).

One issue in developing a feedback LNA with a resistor (e.g., LNA circuit 104 shown in FIG. 2) is the difficulty in maintaining a relatively constant Rin over a desired operational frequency range (e.g., 50 MHz to 3 GHz). Although some other feedback LNAs exist, many of them have an Rin that begins to increase at frequencies that are too low to be useful. For example, some existing LNAs have Rin values that begin to increase in the MHz range. For broadband applications, it would preferable if Rin were (relatively) constant (e.g., at 50Ω) until the GHz range. One traditional solution to this problem is to use inductors. However, in at least some applications it is undesirable to use inductors and a solution that does not use inductors would be desirable.

The following figures show some examples of feedback LNA circuits that overcome the issues described above.

Figure 4:
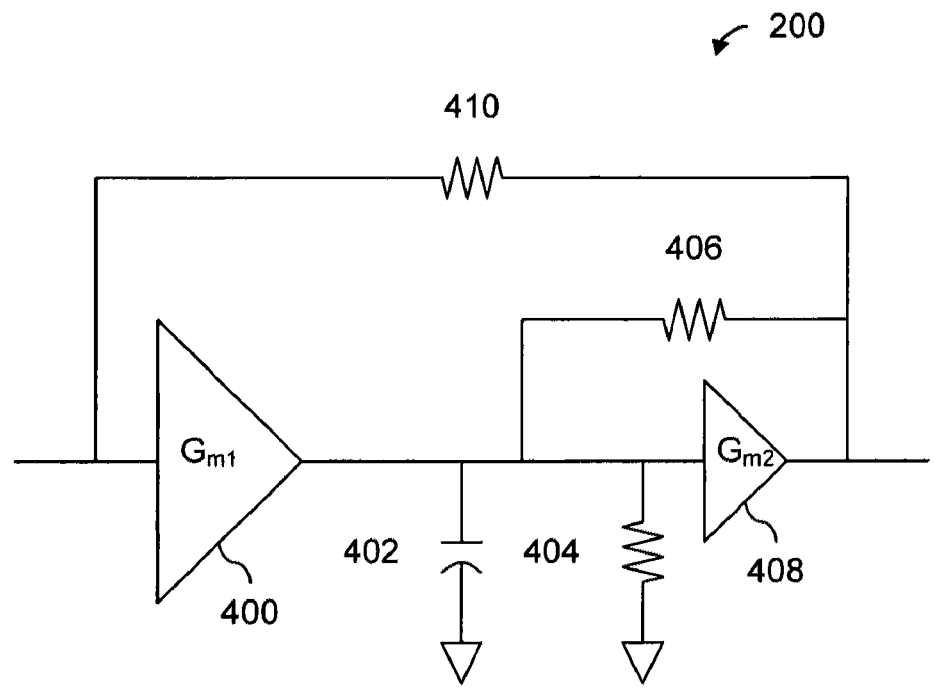
FIG. 4 shows an example of a feedback LNA circuit with a resistor that has a desirable Rin frequency response.
Figure 4:
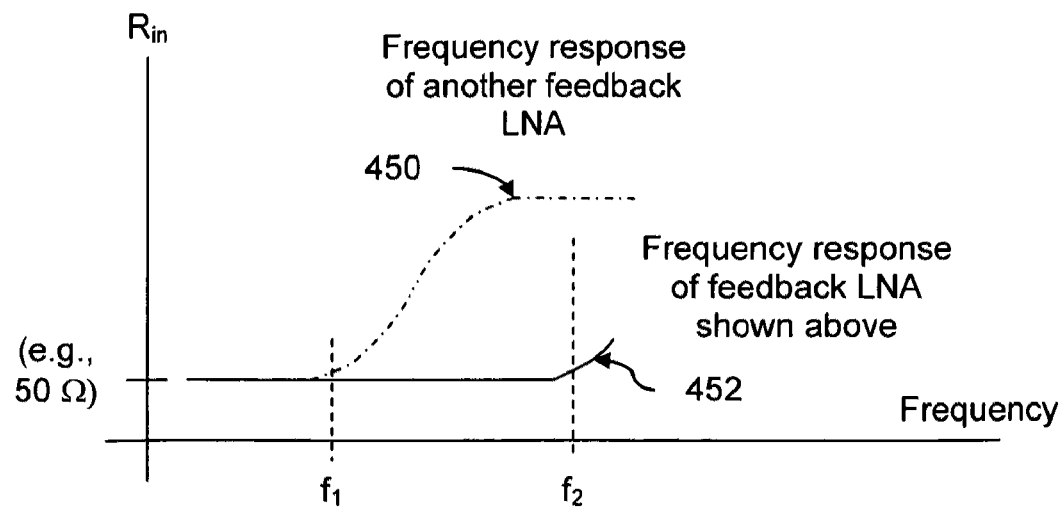

FIG. 4 shows an example of a feedback LNA circuit with a resistor that has a desirable Rin frequency response. In this example, feedback LNA 200 of FIG. 2 is implemented as the circuit shown in this figure. In some other embodiments, feedback LNA 200 is configured differently. In this example, the output of a first transconductor (400) is coupled to a capacitor (402) to ground, a resistor (404) to ground, one end of another resistor (406), and the input of a second transconductor (408). The output of the second transconductor (408) and the other end of resistor 406 are coupled together, as well as to a third resistor (410). The other end of the third resistor (410) is coupled to the input of the first transconductor (400). The Gm2 value of the second transconductor (408) is smaller than the Gm1 value of the first transconductor (400) in this particular example.

Compared to some other feedback LNA circuits, the circuit shown in this figure has a higher corner frequency at which Rin begins to increase. FIG. 4 shows the frequency response of Rin for the LNA circuit shown in this figure and for another LNA circuit (not shown). Dashed and dotted line 450 shows a frequency response for Rin of another feedback LNA circuit. At the corner frequency f1, the input resistance Rin begins to increase. In some cases, f1 is on the order of a few MHz which is too low for a broadband application.

Solid line 452 shows the frequency response of Rin for the feedback LNA shown in this figure. The corner frequency (f2) at which Rin begins to increase is larger than f1. The frequency f2 is approximately is technology dependent. In some cases, f2 is approximately 1 GHz. In some other cases, f2 is approximately 6 GHz.

The feedback LNA circuit shown in this figure is described in U.S. Pat. No. 7,312,659 by Farbod Aram entitled MULTI-AMPLIFIER CIRCUIT which is incorporated herein by reference for all purposes.

Figure 5:
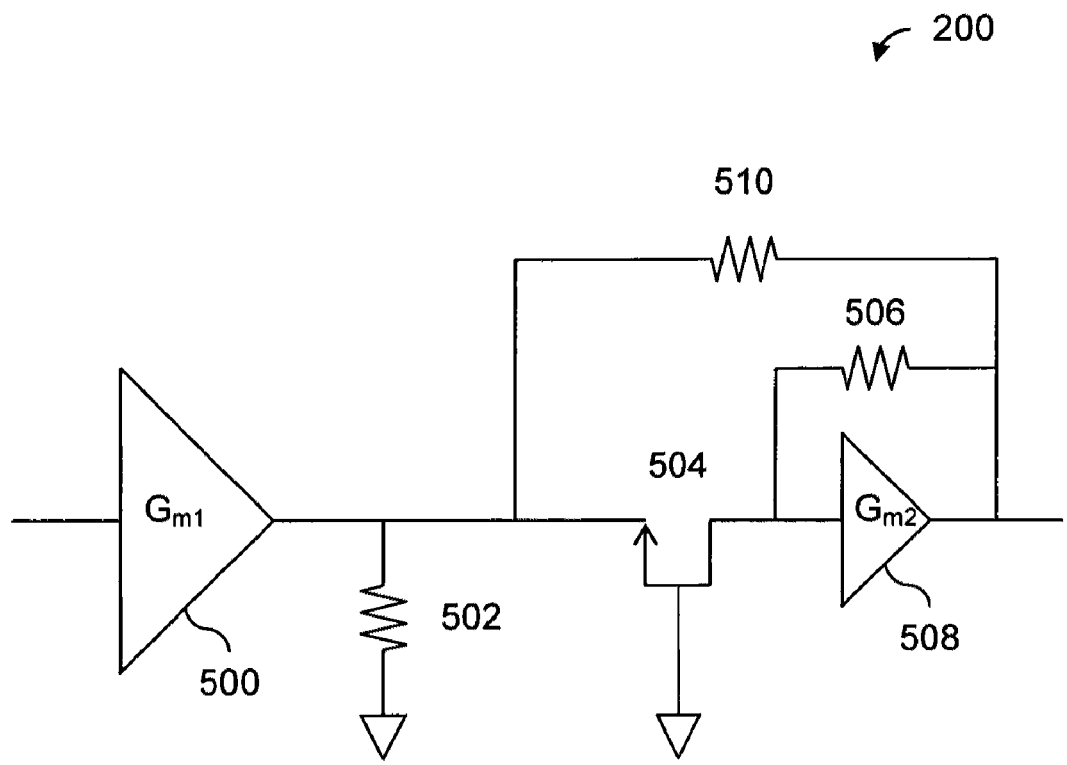
FIG. 5 shows an example of an LNA circuit having a common gate transistor with a desirable Rin frequency response.

FIG. 5 shows an example of an LNA circuit having a common gate transistor with a desirable Rin frequency response. In this example, feedback LNA 200 of FIG. 2 is implemented as the circuit shown in this figure. In some other embodiments, feedback LNA 200 is configured differently. In this example, the feedback LNA includes a first transconductor (500), the output of which is coupled to a resistor to ground (502), the source of a common gate transistor (504), and a second resistor (510). The drain of common gate transistor 504 is connected to a third resistor (506) and the input of a second transconductor (508). The output of the second transconductor 508 is connected to the other end of the third resistor (506), as well as the other side of the second resistor (510).

The circuit shown in FIG. 5 consumes less power than the circuit shown in FIG. 4 and is able to operate over a larger frequency range. In some applications (e.g., wireless or other applications with a battery or software defined radio), this is attractive.

The LNA circuit shown in this figure is described in U.S. Publication No. 2008/0079494 by Aram et al. entitled BROADBAND LOW NOISE AMPLIFIER which is incorporated herein by reference for all purposes.

FIGS. 4 and 5 show some examples of feedback LNA circuits used to implement feedback LNA 200 in FIG. 2. Any appropriate feedback LNA can be used and in some other embodiments feedback LNA 200 is implemented in some other manner than the examples shown here.

One issue with the LNA circuits shown in FIGS. 4 and 5 is saturation. For example, because of out of band blockers, a large amount of current passes through the circuit, causing large swings at the output of a second transconductor (e.g., 408 or 508).

One traditional method to solve this is to attach a surface acoustic wave (SAW) filter externally, for example at the input of the first transconductor (e.g., 400 or 500). In at least some applications, SAW filters are undesirable because they are expensive and are frequency specific. This is undesirable in broadband applications where operation over a relatively large frequency range is desired (e.g., in software defined radio).

Figure 6:
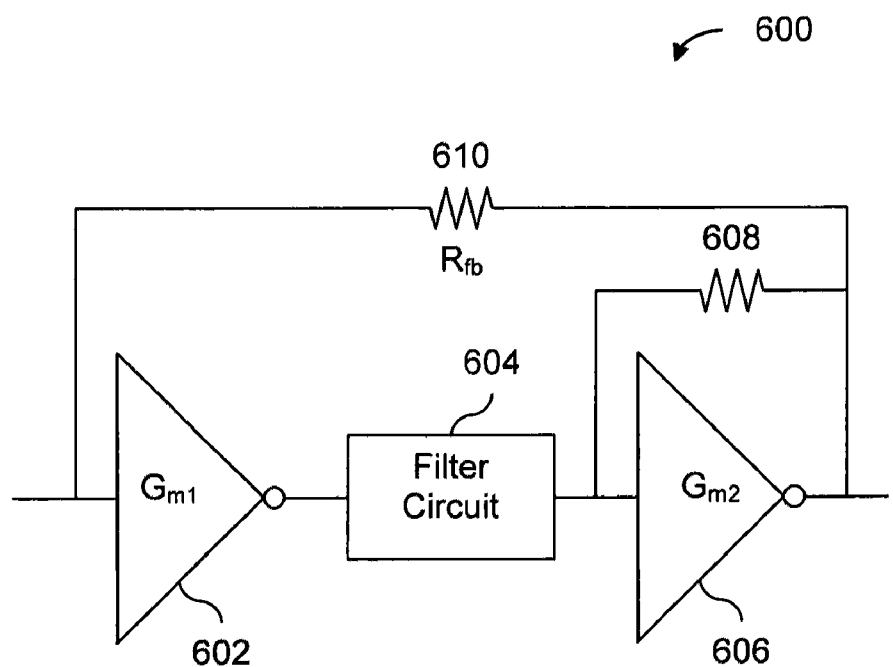
FIG. 6 is a diagram illustrating an embodiment of a LNA circuit with an internal filter.
Figure 6:
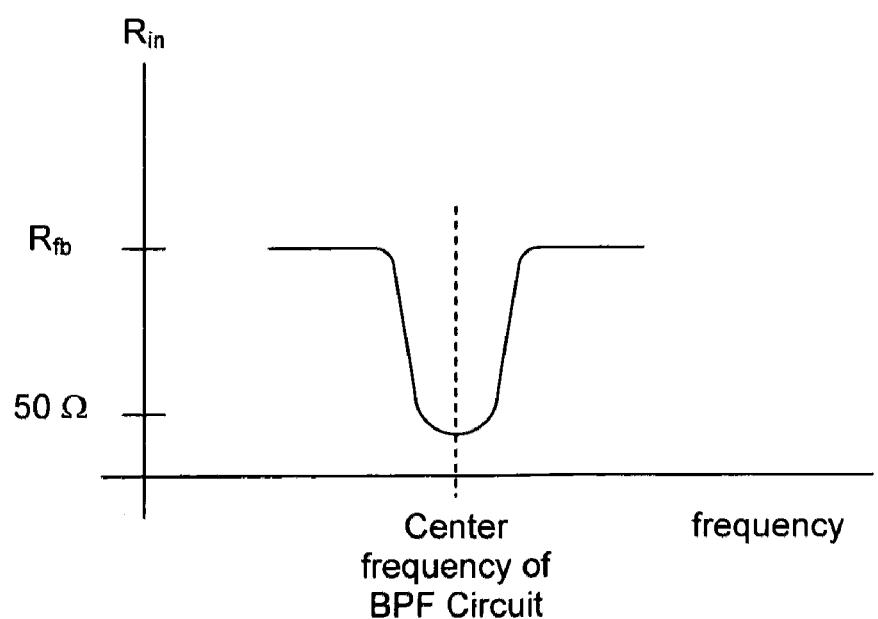

FIG. 6 is a diagram illustrating an embodiment of a LNA circuit with an internal filter. In the example shown, LNA circuit 600 includes a first inverting transconductor (602), the output of which is coupled to the input of filter circuit 604. In various embodiments, filter circuit 604 includes a low pass filter, a band pass filter, or a high pass filter. The output of filter circuit 604 is coupled to one end of a first feedback resistor (608), as well as the input of a second transconductor (606). The other end of the first feedback resistor (608) and the output of the second transconductor (606) are coupled together and to one end of a second feedback resistor (610) with a value of Rfb. The other end of the second feedback resistor (610) is coupled to the input of the first transconductor (602). In this particular example, the first transconductor (602) and the second transconductor (606) are inverting. In some embodiments, the second transconductor (606) is smaller than the first transconductor (602).

LNA circuit 600 has improved saturation performance because of filter circuit 604 (sometimes referred to as an internal filter). What is disclosed herein is a feedback LNA with an internal filter, and LNA circuit 600 is merely one such example. In some embodiments, an LNA circuit with an internal filter is configured differently (e.g., the transconductors are non-inverting).

The input resistance of LNA circuit 600 is given by Rin=Rfb/A. A is the total gain from the input of transconductor 602 to the output of transconductor 606. The transfer function is not flat and Rin varies as a function of frequency.

The input resistance of LNA circuit 600 has some attractive characteristics. In the frequency range over which filter 604 permits signals to pass through, Rin is relatively constant. Outside of this range, rejection occurs and Rin increases. FIG. 6 shows an example frequency response in which filter circuit 604 is a band pass filter and Rin over the band pass range is 50Ω. Rin is therefore 50Ω for the frequency range of interest and rejects signals outside of that range.

In some embodiments, filter circuit 604 includes all or mostly all passive components (i.e., no or few transistors). For example, it would not be desirable for a high speed application operating in the GHz range to include GM filters or GM-C filters.

In some embodiments, filter circuit 604 is a band pass filter and the band pass region is configurable so that the system can operate in various frequency ranges of interest. The following figure shows one such embodiment that is not fixed to a particular frequency range of interest.

Figure 7A:
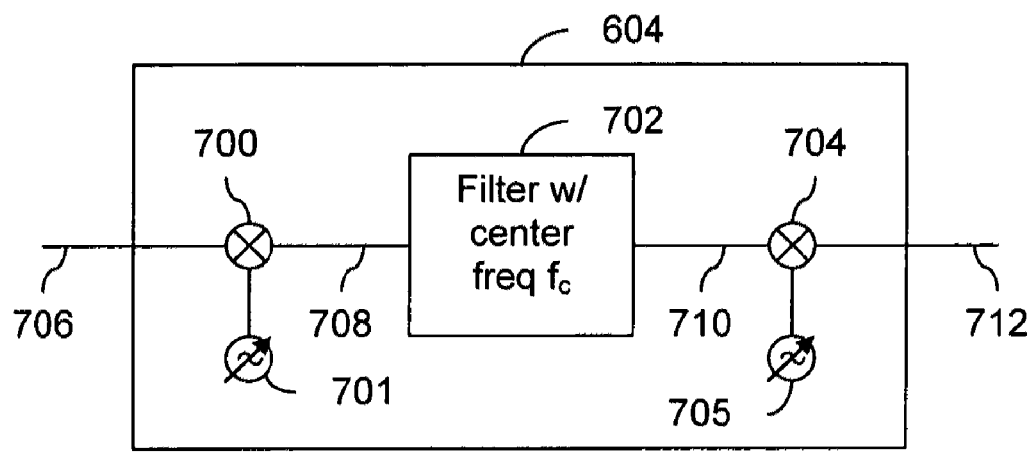
FIG. 7A is a diagram illustrating an embodiment of a filter with an adjustable frequency range of interest.

FIG. 7A is a diagram illustrating an embodiment of a filter with an adjustable frequency range of interest. In some embodiments, filter circuit 604 in FIG. 6 includes this circuit. An input signal 706 is input and passed to mixer 700. Mixer 700 is configured to receive input signal 706 and shift it up in frequency. The amount input signal 706 is shifted up in frequency is based on the signal output by variable oscillator 701. Frequency up shifted signal 708 is passed from mixer 700 to filter 702 which has a center frequency of fc. Filter 702 permits frequencies at or around fc to pass through and rejects other frequencies. In this example, fc is fixed and the frequency of interest is changed by adjusting variable oscillators 701 and 705. For example, if the frequency (range) of interest is centered around 1 GHz and the fc of filter 702 is at 6 GHz, oscillators 701 and 705 are configured to operate at 5 GHz. If the frequency (range) of interest is higher, then oscillators 701 and 705 are reduced in frequency by a corresponding amount since less up shifting is required. Filtered signal 710 is passed to mixer 704 which frequency down shifts the signal based on the frequency of the signal output by variable oscillator 705. In this example, the amount of frequency up shifting and down shifting performed by mixers 700 and 704 and oscillators 701 and 705 are the same amount. The frequency down shifted signal is output as signal 712.

Figure 7B:
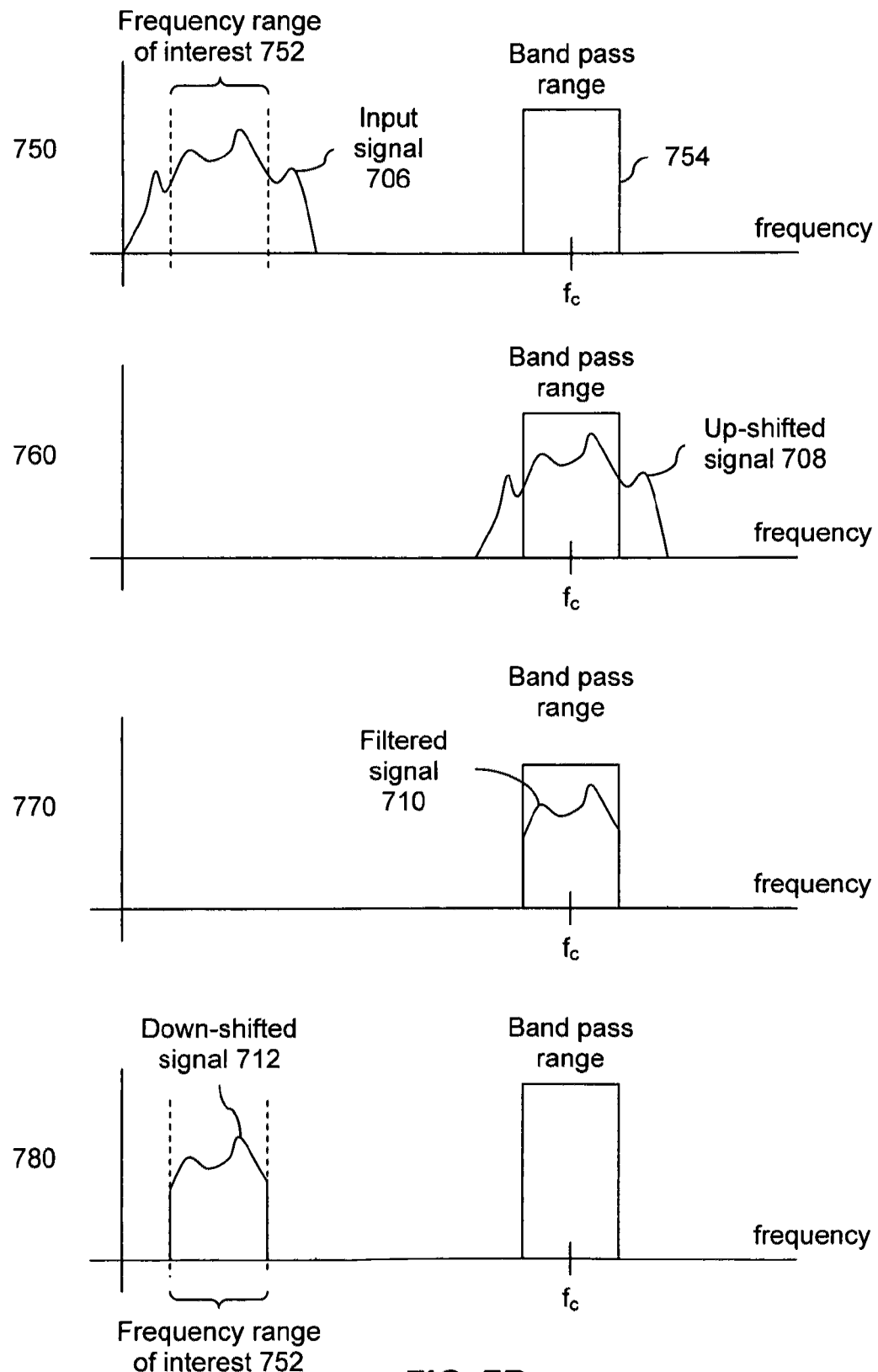
FIG. 7B is a diagram showing an embodiment of frequency up shifting, filtering, and frequency downshifting of a signal.

FIG. 7B is a diagram showing an embodiment of frequency up shifting, filtering, and frequency downshifting of a signal. In the example shown, a signal is processed using the circuit shown in FIG. 7A. In frequency spectrum 750, input signal 706 is received. Input signal 706 includes desired frequencies (corresponding to frequency range of interest 752) and undesired frequencies (outside of frequency range of interest 752). The width of the frequency range of interest (752) matches the width of the band pass range (754). In the example shown, band pass range 754 is shown as an ideal filter that perfectly rejects or perfectly permits a particular frequency to pass through. A real life filter will typically have "rounding" at the edges.

In frequency spectrum 760, input signal 706 has been shifted up in frequency, resulting in signal 708. In frequency spectrum 770, up shifted signal 708 has been filtered, resulting in filtered signal 710; frequencies outside of band pass range 754 have been removed. Filtered signal 710 is then down shifted in frequency, resulting in down shifted signal 712 shown in frequency spectrum 780.

In some applications, it is desirable to have a filter (e.g., filter 702 in this figure or filter 604 in FIG. 6) with sharp edges or "roll off." For example, this permits more of a desired frequency range to be selected and/or better rejection of undesired frequencies. In some wireless communication standards, different channels are only be separated by 10 MHz. The following figures show some example filters with desirable characteristics (e.g., a sharp "roll off") that are used in some embodiments in an internal filter of a LNA.

Figure 8:
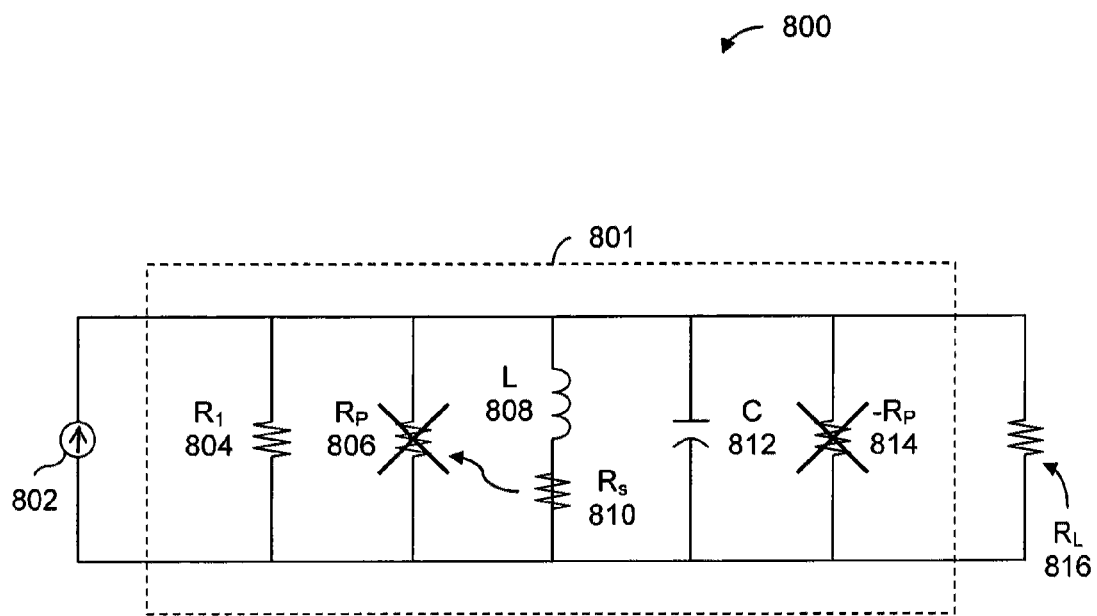
FIG. 8 is a diagram showing an embodiment of a filter with Q enhancement.

FIG. 8 is a diagram showing an embodiment of a filter with Q enhancement. In the example shown, circuit 800 includes current source 802, filter 801, and load 816 (shown as a resistor) connected in parallel. Filter 801 includes resistor 804 (with a value of R1), resistor 806 (with a value of Rp), inductor 808 and series resistor 810 (connected in series), capacitor 812 (with a value of C), and negative resistor 814 (with a value of −Rp) connected in parallel.

In the example shown, series resistor 810 and parallel resistor 806 are not actual components of filter 801. They are included to model the real-world behavior of inductor 808 and if filter 801 were manufactured, the manufactured circuit would not include resistors 806 and 810. Real world inductors have some resistance, which is modeled by series resistor 810 with a value of Rs. Series resistor 810 has been converted into an equivalent parallel resistor (i.e., parallel resistor 806) for convenience and when discussing or modeling the real world behavior of inductor 808 only one of resistors 806 and 810 are considered.

The resistance (Rp) of parallel resistor 806 is given by:

$$Rp=(\omega L)^2/Rs$$

In one example, $Rs \approx 3\Omega$, $(\omega L)^2 \approx (30\Omega)^2$, and therefore $Rp \approx 300\Omega$.

The parameter Q for filter 801 (without negative resistor 814) is given by:

$$Q=\omega L/Rs$$

where a high Q value corresponds to a good filter with sharp edges or roll-off. The higher the value of Rs, the lower the value of Q and performance degrades.

To improve the value of Q (i.e., better than $Q=\omega L/Rs$), filter 801 includes negative resistor 814 with a value of −Rp. Resistors 806 and 814 cancel each other out since they are in parallel, have the same magnitude, and one of the values in negative. Including a negative resistor as shown is referred to as Q enhancement. Some embodiments of an LNA with an internal filter use Q enhancement to improve the edges or roll off of the filter's band pass region.

Figure 9:
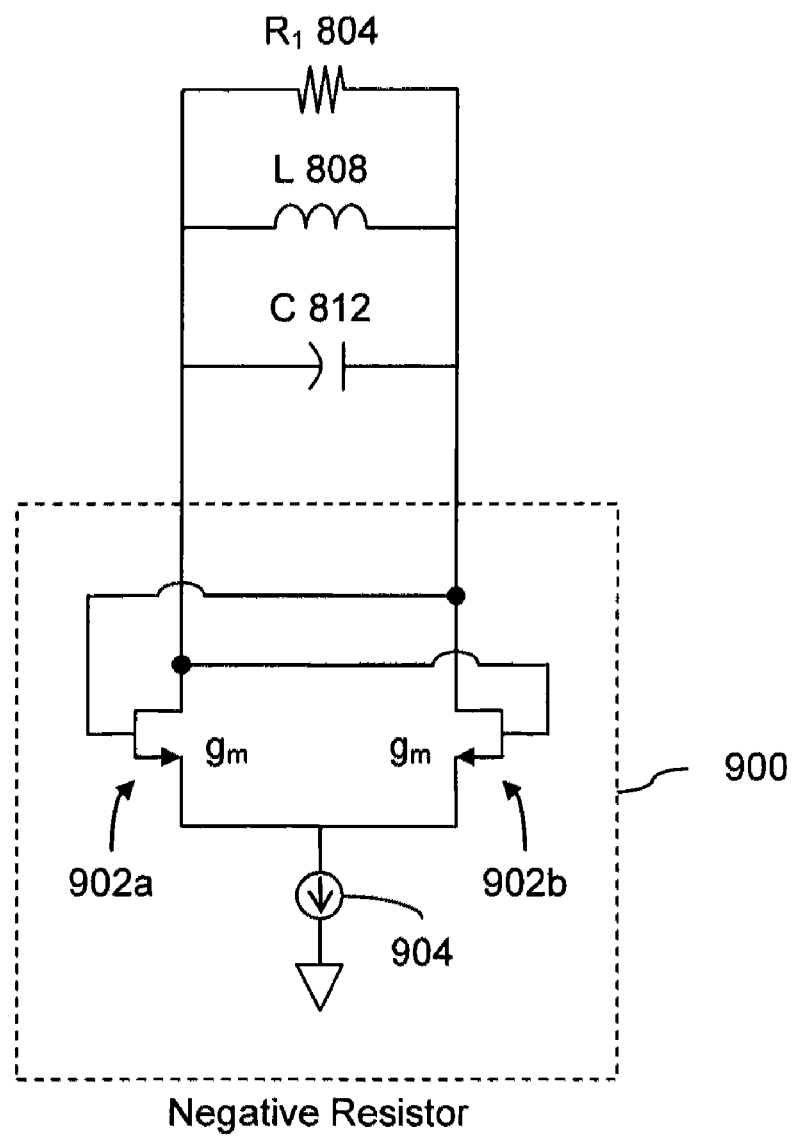
FIG. 9 is a diagram illustrating an embodiment of a negative resistor.

FIG. 9 is a diagram illustrating an embodiment of a negative resistor. In some embodiments, a negative resistor (e.g., negative resistor 814 in FIG. 8) is implemented as negative resistor 900. In the example shown, negative resistor 900 includes transistors 902a and 902b and current source 904. The sources of transistors 902a and 902b are connected to each other and to current source 904. The gate of one transistor is connected to the drain of the other transistor and vice versa. The drain of transistor 902a forms one end of negative resistor 900 and the drain of transistor 902b forms the other end. The value of gm is based upon the amount of current passing through current source 904.

In this example, the input resistance of negative resistor 900 is given by:

$$Rin=-2/gm$$

As a result, changing the current causes gm to change, which in turn causes Rin to change. When included in a filter to enhance Q, the negative Rin value cancels out another resistor with the same (positive) value.

Figure 10:
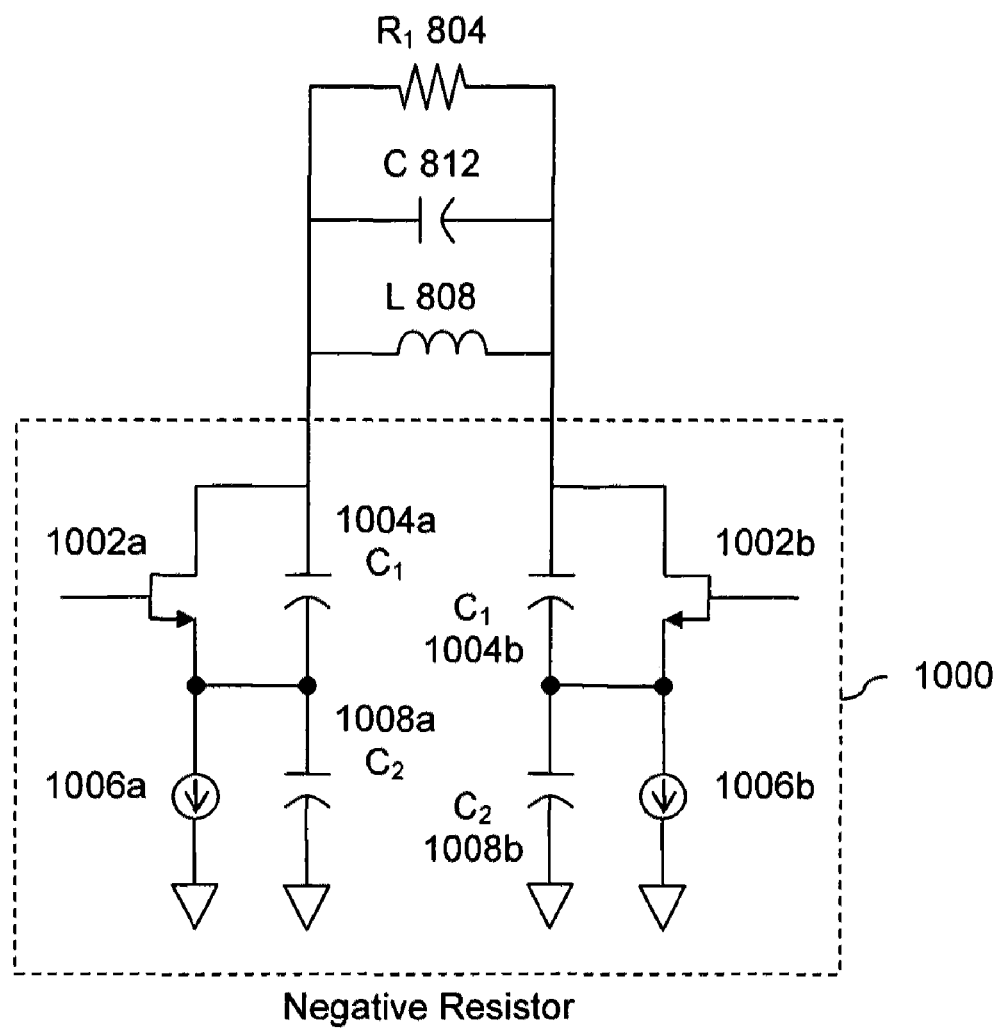
FIG. 10 is a diagram illustrating an embodiment of a negative resistor with Colpitts oscillators.

FIG. 10 is a diagram illustrating an embodiment of a negative resistor with Colpitts oscillators. In some embodiments, a negative resistor (e.g., negative resistor 814 in FIG. 8) is implemented as negative resistor 1000. In the example shown, negative resistor 1000 includes transistors 1002a and 1002b. The gates of transistors 1002a and 1002b are biased appropriately (not shown). The drains of transistors 1002a and 1002b are connected (respectively) to one end of capacitors 1004a and 1004b. Both capacitors 1004a and 1004b have a value of C1. The other ends of capacitors 1004a and 1004b are connected (respectively) to the sources of transistors 1002a and 1002b. In addition, the source of transistor 1002a is also connected to current source 1006a and to a capacitor to ground (1008a). Similarly, the source of transistor 1002b is also connected to a second capacitor to ground (1008b) and current source 1006b. Both capacitors 1008a and 1008b have a value of C2.

In the previous figures, the circuits shown included one or more current sources. One potential issue with current sources is that they are noisy. Another issue is that the circuits will mimic any movement if there is a perturbation in the circuit. Another potential issue is a negative resistor often has to a lot of swing across it and the negative resistor should have good linearity. The following figures show some embodiments of circuits that address these issues.

Figure 11A:
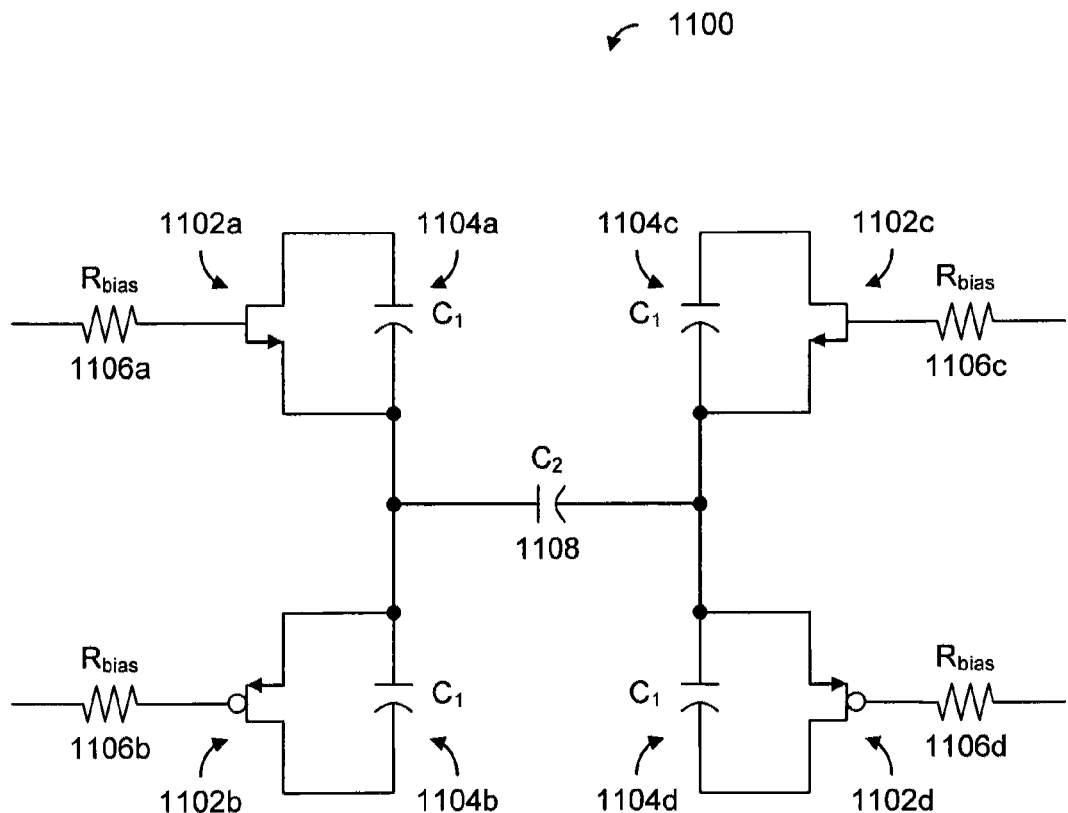
FIG. 11a is a diagram illustrating an embodiment of a negative resistor that does not use a current source.

FIG. 11a is a diagram illustrating an embodiment of a negative resistor that does not use a current source. Negative resistor 1100 includes transistors 1102a-1102d. Transistors 1102a and 1102c are n-type transistors and transistors 1102b and 1102d are p-type transistors. Each of transistors 1102a-1102d are connected to a respective one of capacitors 1104a-1104d, each of which has a value of C1. One end of a given capacitor is connected to the drain of its corresponding transistor and the other end of the capacitor is connected to the source. Each of transistors 1102a-1102d is also connected at the gate to a respective one of resistors 1106a-1106d. These resistors are bias resistors and have a value of Rbias. The source of transistor 1102a is connected to the source of transistor 1102b, as well as one end of capacitor 1108 with a value of C2. The other end of capacitor 1108 is connected to the source of transistor 1102c and to the source of transistor 1102d.

Capacitors 1104a-1104d are positive feedback capacitors. Capacitor 1108 is a ratio up capacitor. Noise from transistors 1102b and 1102d respectively reduce the noise from transistors 1102a and 1102c so that the overall noise is reduced. Also, if there is extra current that goes to transistor 1102a or 1102c (e.g., because of a perturbation from an electrically coupled component) the circuit can "push-pull" which maintains the linearity of the circuit. For example, extra current at transistor 1102c passes through transistor 1102b and extra current at transistor 1102a passes through transistor 1102d. As a result, even if there is a perturbation the current will come and go without having a constant current source somewhere.

Figure 11B:
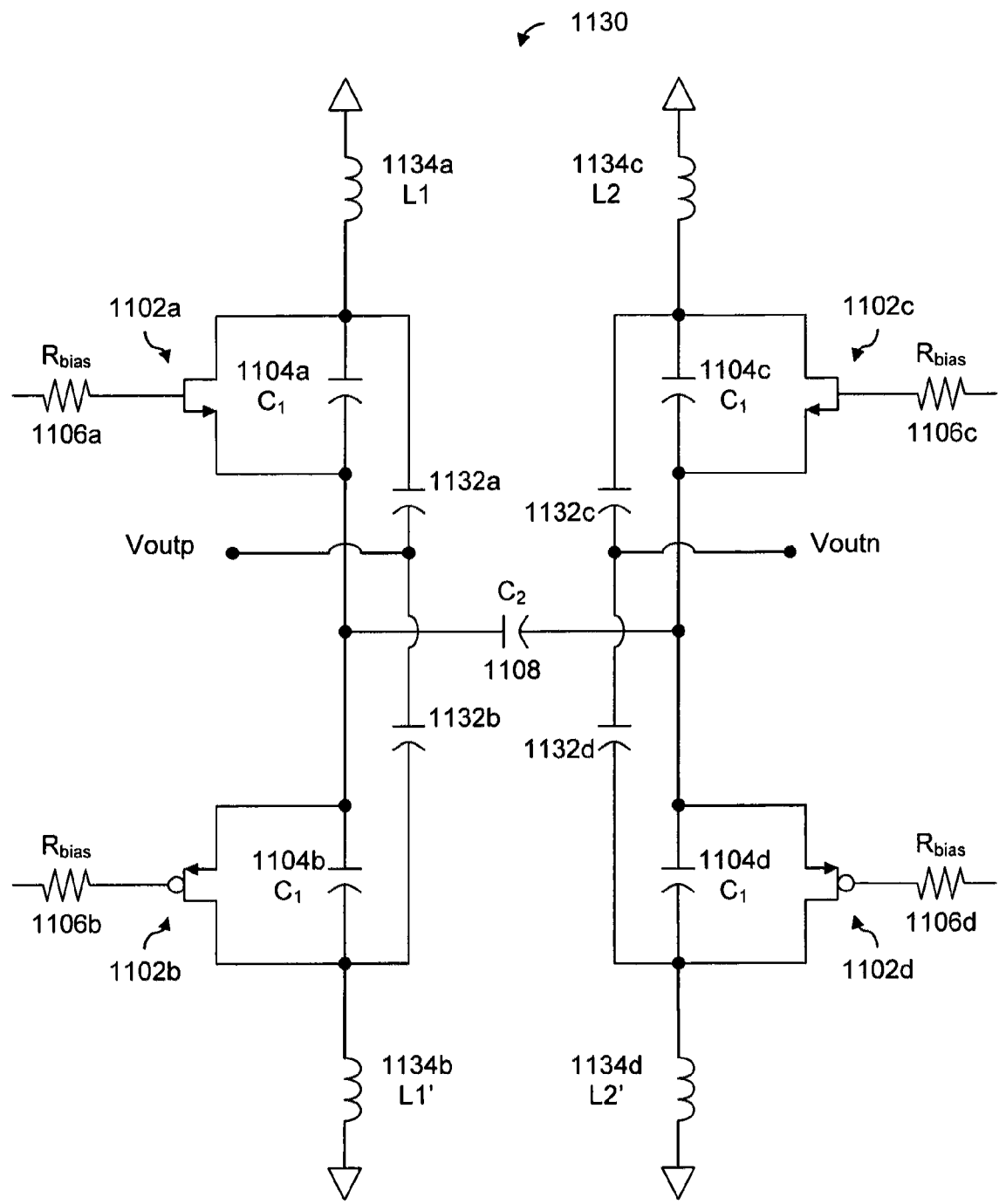
FIG. 11b is a diagram illustrating an embodiment of a negative resistor without a current source.

FIG. 11b is a diagram illustrating an embodiment of a negative resistor without a current source. In the example shown, circuit 1130 is the same as circuit 1100 with the addition of capacitors 1132a-1132d and inductors 1134a-1134d. In this example, one end of inductor 1134a is coupled to a power source and the other end is coupled to the drain of transistor 1102a. Similarly, inductor 1134c is couple to a power source and to the drain of transistor 1102c. Inductors 1134b and 1134d are similarly connected. One end of inductor 1134b is connected to ground and the other end is connected to the drain of transistor 1102b. Inductor 1134d is on one end to connected to ground and on the other end to the drain of transistor 1102d.

One end of capacitor 1132a is coupled to the drain of transistor 1102a; the other end of the capacitor is coupled to capacitor 1132b. The other end of capacitor 1132b is coupled to the drain of transistor 1102b. Similarly, one end of capacitor 1132c is coupled to the drain of transistor 1102c and the other end is coupled to capacitor 1132d. The other end of capacitor 1132d is coupled to the drain of transistor 1102d.

The positive and negative outputs (Voutp and Voutn, respectively) are at the connection between capacitors 1132a and 1132b and the connection between capacitors 1132c and 1132d.

Figure 11C:
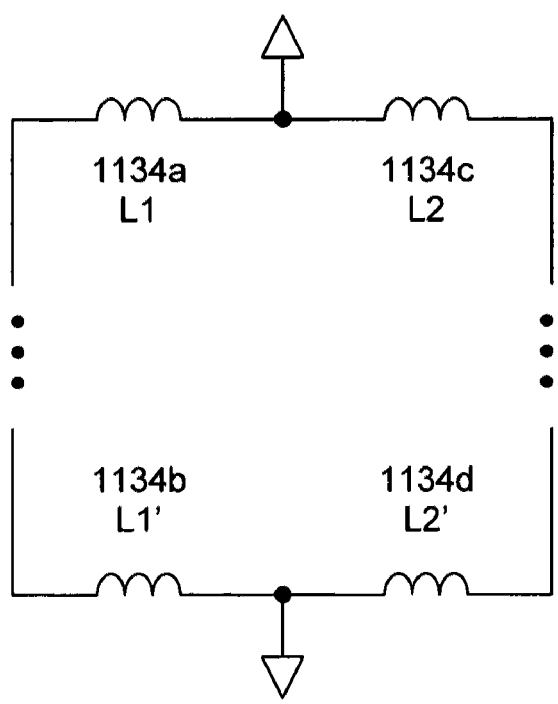
FIG. 11c is a diagram illustrating an embodiment of inductors implemented as coupled transformers.
Figure 11C:
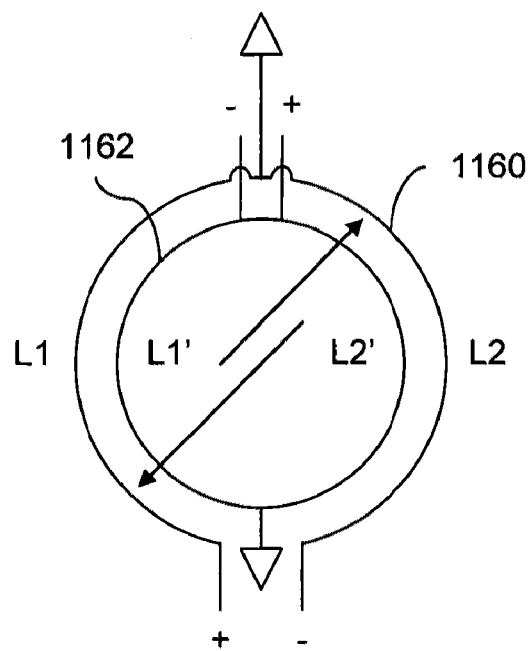

FIG. 11c is a diagram illustrating an embodiment of inductors implemented as coupled transformers. In some embodiments, inductors (e.g., 1134a-1134d from FIG. 11b) are implemented as shown. In some embodiments, an inductor is implemented in some other manner.

In the example, the inductors are laid out as two coupled transformers. There are two loops: loop 1160 and loop 1162. Loop 1160 is used to implement inductors 1134a (L1) and 1134c (L2). Loop 1162 is used to implement inductors 1134b (L1') and 1134d (L2'). Laid out as shown, space is saved (e.g., as opposed to having separate coils).

In this example, the polarity of the inductors is opposing (note the positive and negative polarities of loops 1160 and 1162) so that the two magnetic (B) fields from loop 1160 and loop 1162 cancel each other output. As a result, the two inductors on top (e.g., 1134a and 1134c) have current going in the opposite direction of the inductors on the bottom (e.g., 1134b and 1134d).

Figure 12:
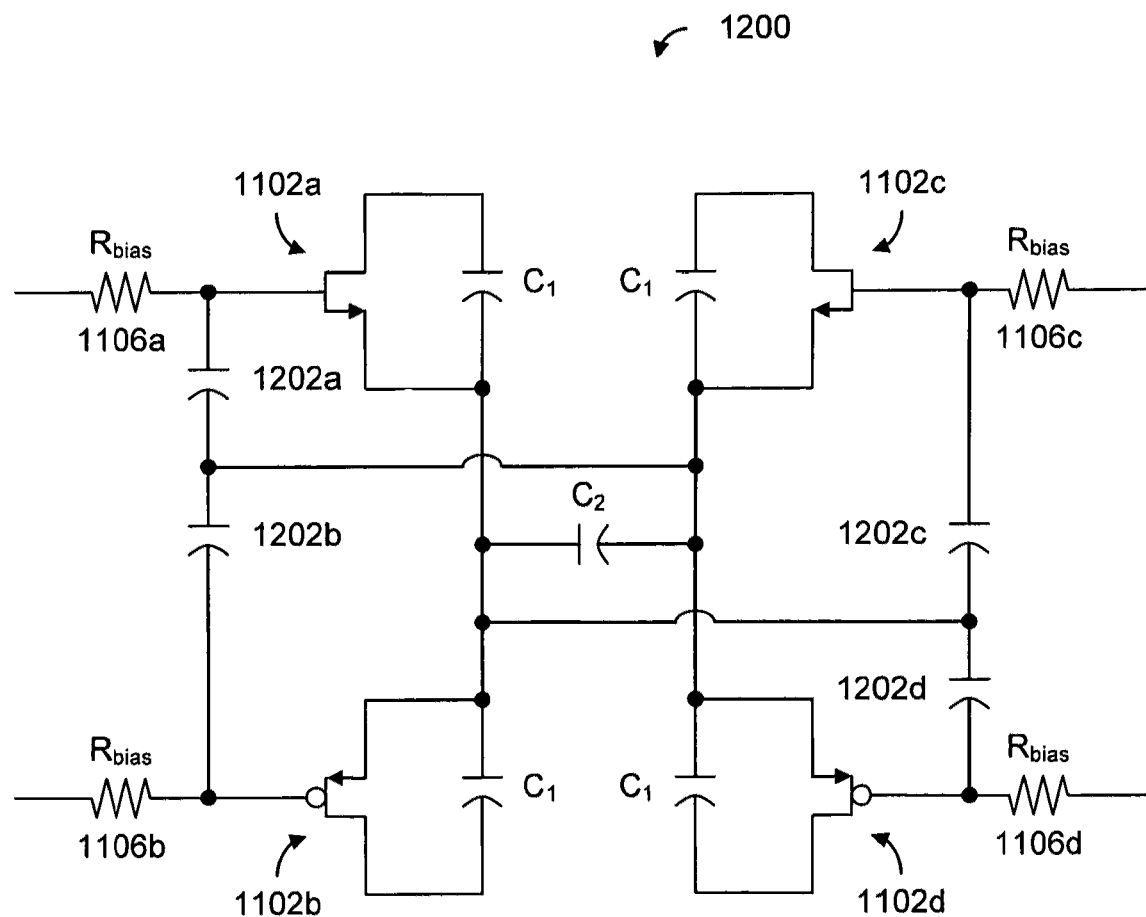
FIG. 12 is a diagram illustrating an embodiment of the previous circuit shown with additional capacitors.

FIG. 12 is a diagram illustrating an embodiment of the previous circuit shown with additional capacitors. In the example shown, circuit 1200 is the same as circuit 1100 from FIG. 11a with the addition of capacitors 1202a-1202d. One end of capacitor 1202a is connected between the gate of transistor 1102a and bias resistor 1106a. The other end of capacitor 1202a is connected to one end of capacitor 1202b and to the sources of transistors 1102c and 1102d. The other end of capacitor 1202b (not connected to capacitor 1202a) is connected between bias resistor 1106b and the gate of transistor 1102b. Similarly, capacitor 1202c is connected between bias resistor 1106c and the gate of transistor 1102c. The other end of capacitor 1202c is connected to one end of capacitor 1202d and to the sources of transistor 1102a and 1102b. The other end of capacitor 1202b is connected between the gate of transistor 1102d and resistor 1106d.

Capacitors 1202a-1202d are noise reduction capacitors and copy noise from singular to differential. For example, if there is noise (e.g., in the form of voltage) at the gate of transistor 1204a, that voltage noise also appears at the drain of transistor 1204a. The drain of transistor 1204a is connected electrically to the gain of transistor 1204b via capacitor 1202c. Via this electrical connection, the voltage noise appears at the gate of transistor 1204b. As a result, the same noise (in the form of current) that is drawn by transistor 1204a is also drawn by transistor 1204b. Similarly, the drain of transistor 1204b is connected to the gate of transistor 1204a via capacitor 1202a and any noise current drawn by transistor 1204b is also drawn by transistor 1204a. The noise is symmetric on both sides.

Figure 13:
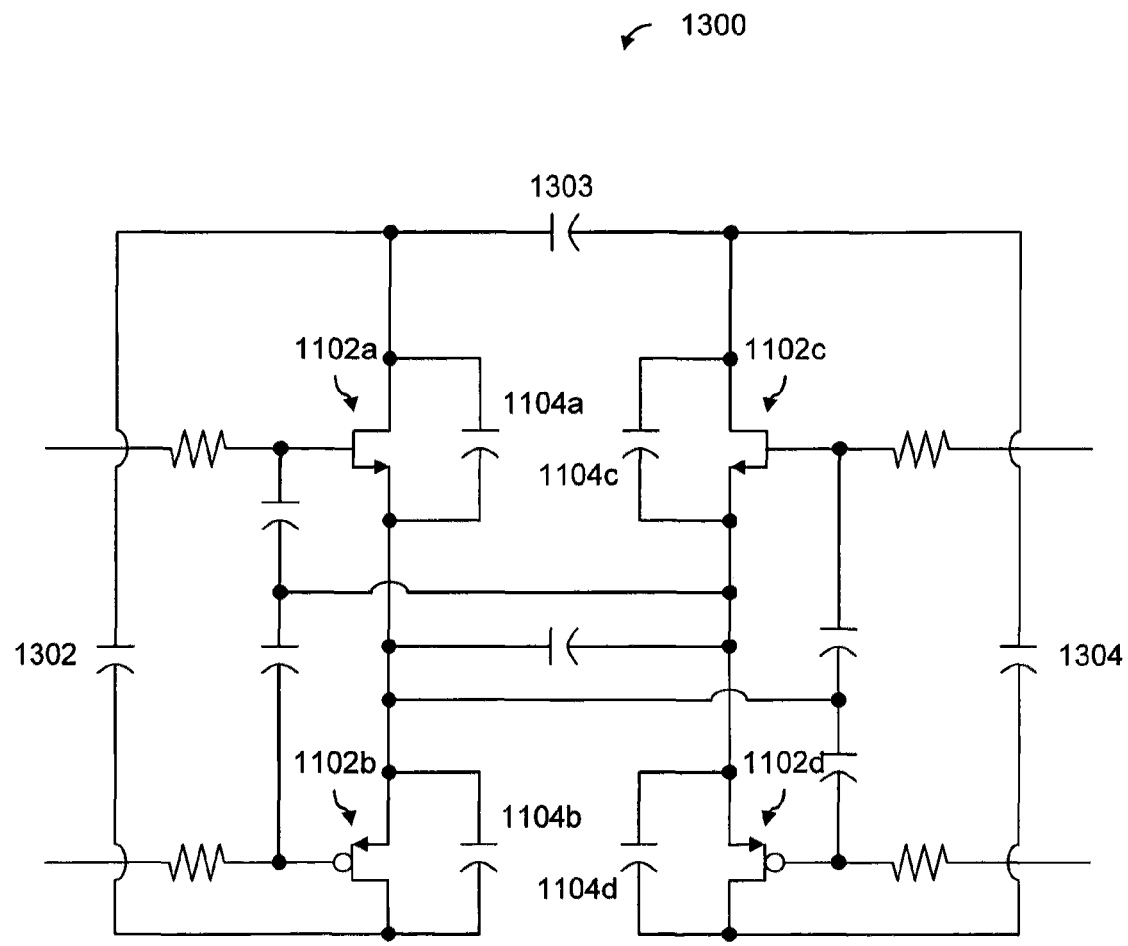
FIG. 13 is a diagram illustrating an embodiment of the previous circuit shown with additional capacitors.

FIG. 13 is a diagram illustrating an embodiment of the previous circuit shown with additional capacitors. In the example shown, circuit 1300 is the same as circuit 1200 from FIG. 12 with the addition of capacitors 1302-1304. One end of capacitor 1302 is connected to the drain of transistor 1102b and to capacitor 1104b. The other end of capacitor 1302 is connected to the drain of transistor 1102a and capacitor 1104a, as well as one end of capacitor 1303. The other end of capacitor 1303 is connected to the drain of transistor 1102c and capacitor 1104c and capacitor 1304. The other end of capacitor 1304 is connected to the drain of transistor 1102d and capacitor 1104d.

In some embodiments, a filter used as an internal filter in a LNA is a multi-stage filter. A multi-stage filter is one in which there are two or more stages of filtering that are separated or isolated by some components or circuitry. Not all multi-stage filters will work when used as an internal filter in an LNA as disclosed herein. For example, one type of a multi-stage filter is a ladder network. An issue with using a ladder network is the variation between the capacitor side and inductor side and is not appropriate for an integrated circuit (IC) design. Another technique is to isolate stages of a multi-stage filter using capacitors. However, at high frequencies (e.g., in the GHz range), the values of these capacitors are quite small (e.g., on the order of 2-3 fF). The value of these capacitors is so low that parasitics would dominate. The following figures show some examples of multi-stage filters that in some embodiments are used in an internal filter of an LNA.

Figure 14:
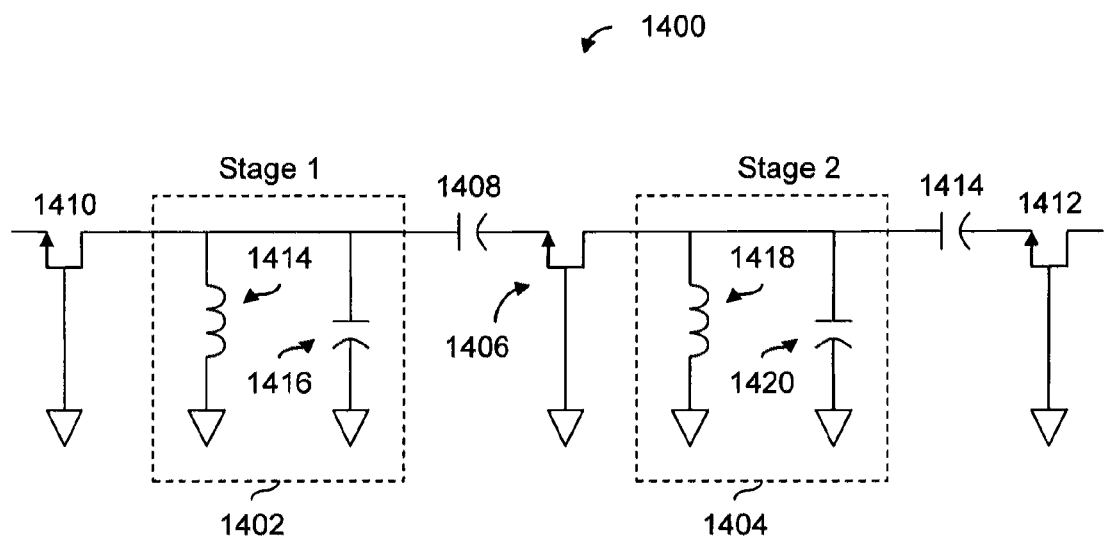
FIG. 14 is a diagram illustrating an embodiment of a multi-stage filter isolated by a capacitor and common gate transistor.

FIG. 14 is a diagram illustrating an embodiment of a multi-stage filter isolated by a capacitor and common gate transistor. In the example shown, circuit 1400 is a two stage filter. In some embodiments, a filter has three or more stages. Circuit 1400 includes common gate transistor 1410, the drain of which is connected to the first stage of the filter (1402). Stage 1 (1402) includes inductor 1414 and capacitor 1416 which go to ground and are connected in parallel. Stage 1 (1402) is in turn connected to one end of capacitor 1408, the other end of which is connected to the source of common gate transistor 1406. The drain of transistor 1406 is connected in turn to the second stage of the filter (1404). Stage 2 (1404) has the same structure in this example as stage 1 (1402) and includes inductor 1418 and capacitor 1420. Stage 2 (1404) is in turn connected to one end of capacitor 1414. The other end of capacitor 1414 is connected to the source of common gate transistor 1412.

The values of inductors 1414 and 1418 and capacitors 1416 and 1420 are selected as appropriate for a desired band pass region. For example, in some cases the desired band pass region is 60 MHz wide. In some embodiments, the values of components in stages 1 and 2 (1402 and 1404) are the same so the band pass region and roll-off of the two stages are identical.

Circuit 1400 includes capacitor 1408 so that a large input resistance is observed by stage 1 (1402). Without capacitor 1408, the input resistance (looking from stage 1 towards stage 2) of transistor 1406 is relatively small (Rin=1/gm). As a result, the Q of stage 1 does not degrade since the resistance observed by stage 1 (i.e., that of capacitor 1408) is relatively high.

Circuit 1400 is merely an example and in other embodiments is configured differently. For example, capacitors 1408 and 1414 are each replaced by a resistor in some configurations. In some embodiments, capacitor 1408 has a resistor in series with it, as does capacitor 1414.

Figure 15:
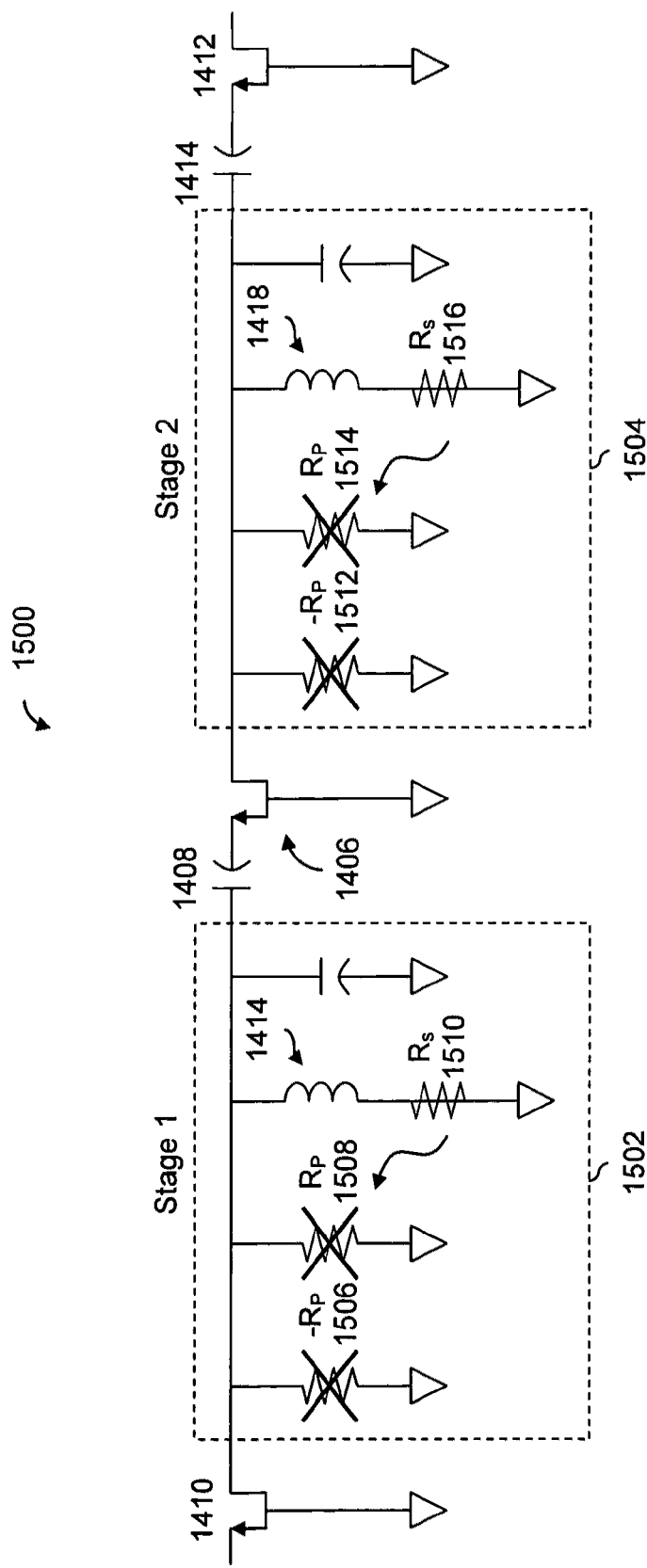
FIG. 15 is a diagram illustrating an embodiment of a two stage filter with a negative resistor in each stage of the filter.

FIG. 15 is a diagram illustrating an embodiment of a two stage filter with a negative resistor in each stage of the filter. In the example shown, filter 1500 has a similar structure as filter 1400 with the addition of negative resistors in each stage. In this example, the real world behavior of inductors 1414 and 1418 are modeled by series resistors 1510 and 1516 with a value of Rs which are in series with inductors 1414 and 1418, respectively. (In this particular example, inductors 1514 and 1518 have the same value of L and therefore Rs is the same for both series resistors. In some other embodiments this is not the case.) Series resistors 1510 and 1516 are converted to equivalent parallel resistors 1508 and 1514 with values of Rp.

Negative resistors 1506 and 1512 with values of −Rp are included (in parallel) to stages 1 and 2, respectively, which cancel out parallel resistors 1508 and 1514, respectively. By including negative resistors 1506 and 1512, the Q performance is improved.

Filters 1500 and 1600 shown in FIGS. 15 and 16, respectively, include a transistor at the input and output of the circuit (i.e., transistors 1510 and 1512). In some embodiments, one or both of these transistors at the input/output of a filter is/are used as a mixer (e.g., mixer 106 in FIG. 1). This is desirable in some applications since additional transistors are not used. Rather than having two additional transistors to perform the mixing, transistor(s) at the input and/or output of a filter are "re-used" as mixers.

Figure 16A:
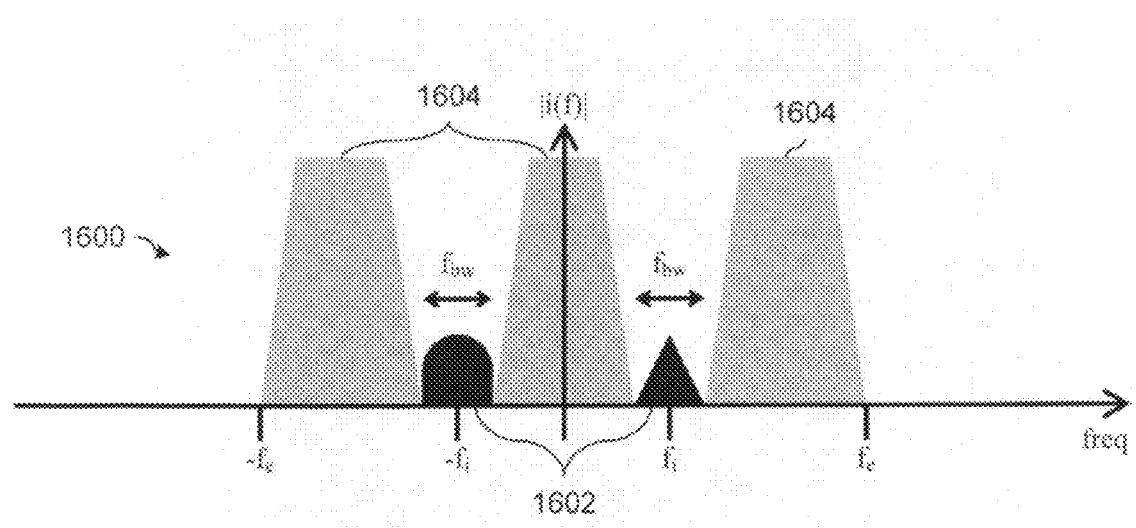
FIG. 16a is a diagram showing an embodiment of a power spectral density of an exemplary input signal.

FIG. 16a is a diagram showing an embodiment of a power spectral density of an exemplary input signal. In the example shown, the input signal (1600) includes a desired signal (1602) that lies at center frequencies $f_i$ (the black triangle) and $-f_i$ (the black dome) and has a bandwidth $f_{bw}$. The undesired signal or blockers (1604) are located in three bands: between $-f_e$ and $-f_i-f_{bw}/2$, between $-f_i+f_{bw}/2$ and $+f_i-f_{bw}/2$, and between $+f_i+f_{bw}/2$ and $f_e$.

Figure 16B:
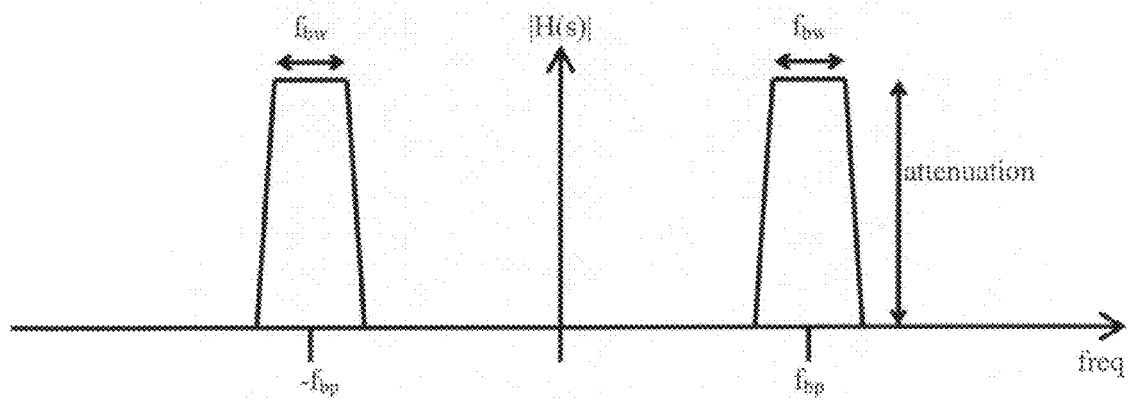
FIG. 16b is a diagram showing an embodiment of a frequency response of a sharp bandpass filter with bandwidth $f_{bw}$ and located at center frequency $f_{bp}$ and $-f_{bp}$.

FIG. 16b is a diagram showing an embodiment of a frequency response of a sharp bandpass filter with bandwidth $f_{bw}$ and located at center frequency $f_{bp}$ and $-f_{bp}$. Although in the diagram $f_{bp}$ is greater than the technique described herein is not limited to that scenario or case. That is, in some embodiments, $f_{bp}$ is lower than or less than $f_i$. In the example shown, the filter has an attenuation associated with it as well as an insertion loss. As used herein, insertion loss is the loss (e.g., in signal power) resulting from inserting a device or component into a signal path. With most mixing techniques, the insertion loss is minimized and the attenuation is maximized by choosing a fixed frequency or a very limited amount of programmability in the filter.

Figure 16C:
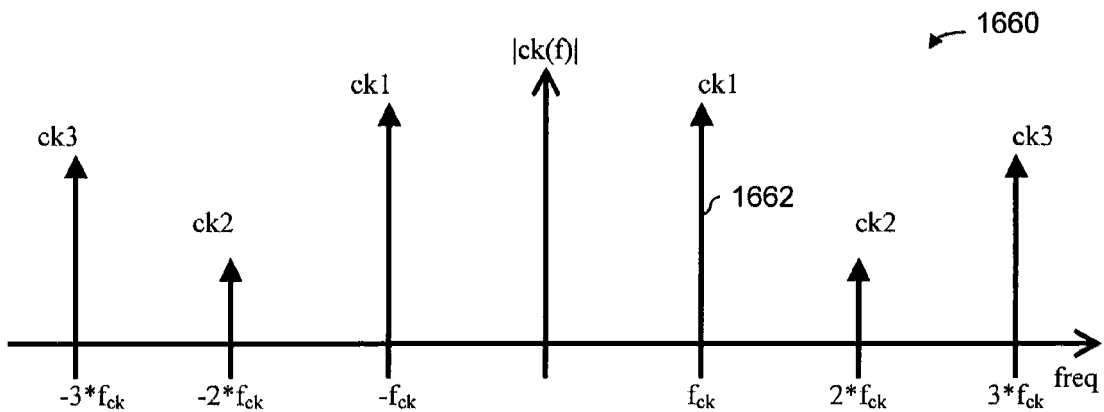
FIG. 16c is a diagram showing an embodiment of a clock signal in the frequency domain.

FIG. 16c is a diagram showing an embodiment of a clock signal in the frequency domain. In the example shown, clock signal 1660 includes signal components at frequencies ±fck, ±2*fck, and ±3*fck. In some embodiments, clock signal 1660 includes components at additional frequencies (e.g., ±4*fck, ±5*fck, etc.). In some embodiments, clock signal 1660 is used as a second input to a mixer. An example of this is described in further detail below. What is described herein is a technique where the clock frequency ($f_{ck}$) is set to a certain value based on the frequency of the desired signal (i.e., $f_i$ in FIG. 16a) and the center frequency of a bandpass filter ($f_{bp}$). This is described in further detail below.

Figure 17:
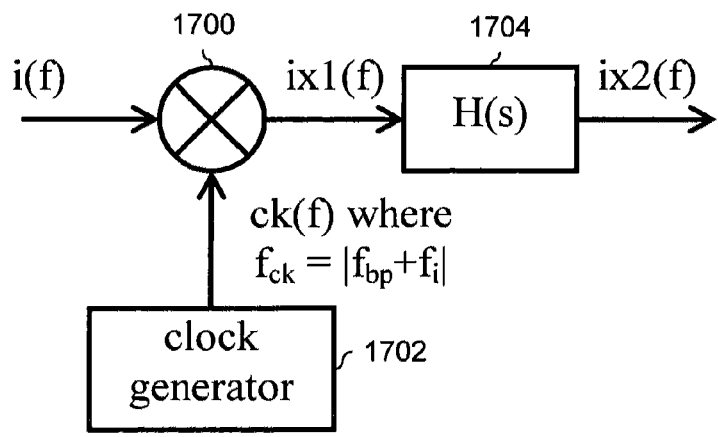
FIG. 17 is a block diagram showing an embodiment of a mixer where the clock signal has a clock frequency ($f_{ck}$) of $|f_{bp}+f_i|$.

FIG. 17 is a block diagram showing an embodiment of a mixer where the clock signal has a clock frequency ($f_{ck}$) of $|f_{bp}+f_i|$. In the example shown, an input signal i(f) (e.g., input signal 1600 shown in FIG. 16a) is passed to a commutative mixer circuit (1700). The commutative mixer has a second input which is clock ck(f). This clock is generated by a clock generator (1702) and has a fundamental oscillation frequency of $f_{ck}$ which has a magnitude ck1 as well as harmonics at $2*f_{ck}$ with magnitude ck2, at $3*f_{ck}$ with magnitude ck3, at $4*f_{ck}$ with magnitude ck4, at $5*f_{ck}$ with magnitude ck5, etc. One example of a clock signal (in the frequency domain) is shown in FIG. 16c.

Returning to FIG. 17, commutative mixer circuit 1700 generates a mixed signal ix1(f) which is passed to bandpass filter H(s) (1704). In some embodiments, bandpass filter 1704 has the frequency response shown in FIG. 16b. Bandpass filter 1704 produces a filtered signal ix2(f).

In some embodiments, clock generator 1702 and/or bandpass filter 1704 are programmable or adjustable. For example, the bandpass region (which includes $f_{bp}$) of filter 1704 may be adjustable and the frequency of the clock generator is adjusted based on what value the frequency $f_{bp}$ is set to (i.e., since $f_{ck}=|f_{bp}+f_i|$, the clock frequency $f_{ck}$ is adjusted or set in accordance with $f_{bp}$).

We would like to translate the desired signal (e.g., desired signal 1602 in FIG. 16a) to the bandpass frequency (e.g., at frequency $\pm f_{bp}$ in FIG. 16b). To achieve this, $f_{ck}$ is set to $|f_{bp}+f_i|$ in this example of the technique. Some other techniques (in contrast) use the lowest clock frequency possible, i.e., $f_{ck}=|f_{bp}-f_i|$.

In general, the output of the mixer (denoted as x1(f) in FIG. 17) can be thought of conceptually as the summation of multiple frequency responses each of which is a scaled and frequency shifted version of the input frequency response i(f). Each response corresponds to each of the tones in the ck(f) frequency response. The scaling factor applied is proportional to the magnitude of the clock tone in question (e.g., ck1, ck2, ck3, etc.) and the frequency shift corresponds to the frequency of the clock tone in question (e.g., $\pm f_{ck}$, $\pm 2*f_{ck}$, $\pm 3*f_{ck}$, etc.). An example of some such scaled and frequency shifted versions of the input frequency response are described below.

Figure 18:
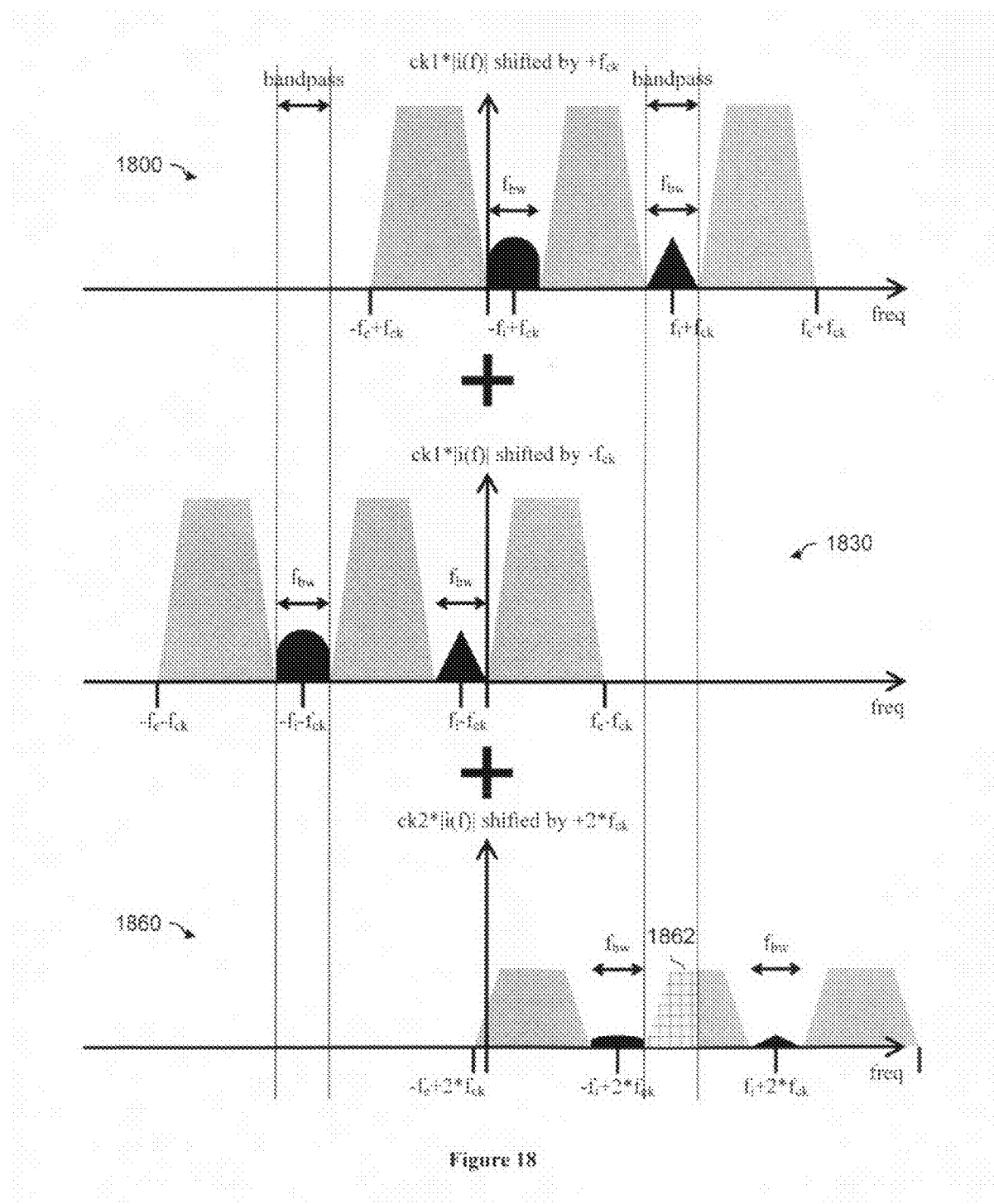
FIG. 18 is a diagram showing an embodiment of scaled and frequency shifted versions of an input frequency response for the clock tones $+f_{ck}$, $-f_{ck}$ and $+2*f_{ck}$ when some other technique is used.

FIG. 18 is a diagram showing an embodiment of scaled and frequency shifted versions of an input frequency response for the clock tones $+f_{ck}$, $-f_{ck}$ and $+2*f_{ck}$ when some other technique is used. In the example shown, the input signal used is shown in FIG. 16a. Diagram 1800 shows the input frequency response when scaled and frequency shifted for clock tone $+f_{ck}$. The clock tone in that example (i.e., at frequency $+f_{ck}$) has a scaling factor of ck1 (see, e.g., clock tone 1662 at frequency $+f_{ck}$ in FIG. 16c) which results in scaling by a factor of ck1 and a frequency shift of $+f_{ck}$ (see, e.g., clock tone 1662 in FIG. 16c). Similarly, diagram 1830 shows the input frequency response scaled and frequency shifted by ck1 and $-f_{ck}$ (respectively) and diagram 1860 shows the input frequency response scaled and frequency shifted by ck2 and $+2*f_{ck}$ (respectively).

As can be seen in diagram 1860 of FIG. 18, the $2*f_{ck}$ frequency response has some signal from blockers that lie within the bandpass region of the filter. See, e.g., blockers signal component 1862 (shown with vertical and horizontal lines) which is an undesirable signal. Since blockers signal component 1862 lies within the bandpass region, it will be included in an output signal (e.g., in signal ix2(f) output by bandpass filter 1704 in FIG. 17) and will introduce noise and affect SNR. It is an attenuated version since ck2 is less than ck1, but having any undesirable noise is undesirable.

One possibility to alleviate this issue (when this other technique is used) is to chose $f_{bp} \gg f_i$. This will ensure that the clock frequency is high enough so that the harmonics don't become an issue. This approach creates a number of issues, such as:

- The bandpass filter can be at a very high frequency thus limiting the amount of programmability. Since the bandpass filter is implemented with inductor and capacitor components, a large portion of the capacitance will be due to parasitics and thus there will be a limited amount of extra capacitance that can be added for programmability while maintaining the high frequency.
- The high frequency filter quality factor will be poor due to eddy currents and skin effects. For the reasons described above, this technique requires the filter to have a bandpass region that is relatively high in frequency and as a result certain high-frequency effects (such as eddy currents and skin effects) will be observed in the system.
- The signal that exits the mixer and propagates through the bandpass filter and any other circuit blocks that follow the filter is at a high frequency ($f_{bp}$) and will suffer from attenuation due to wire and transistor parasitics.

What is described herein is a technique in which $f_{ck}$ is set to a value of $|f_{bp}+f_i|$. This enables some of the issues described above to be overcome. Since the frequency $f_{bp}$ is not limited to high frequencies the issues described above are not applicable.

Figure 19:
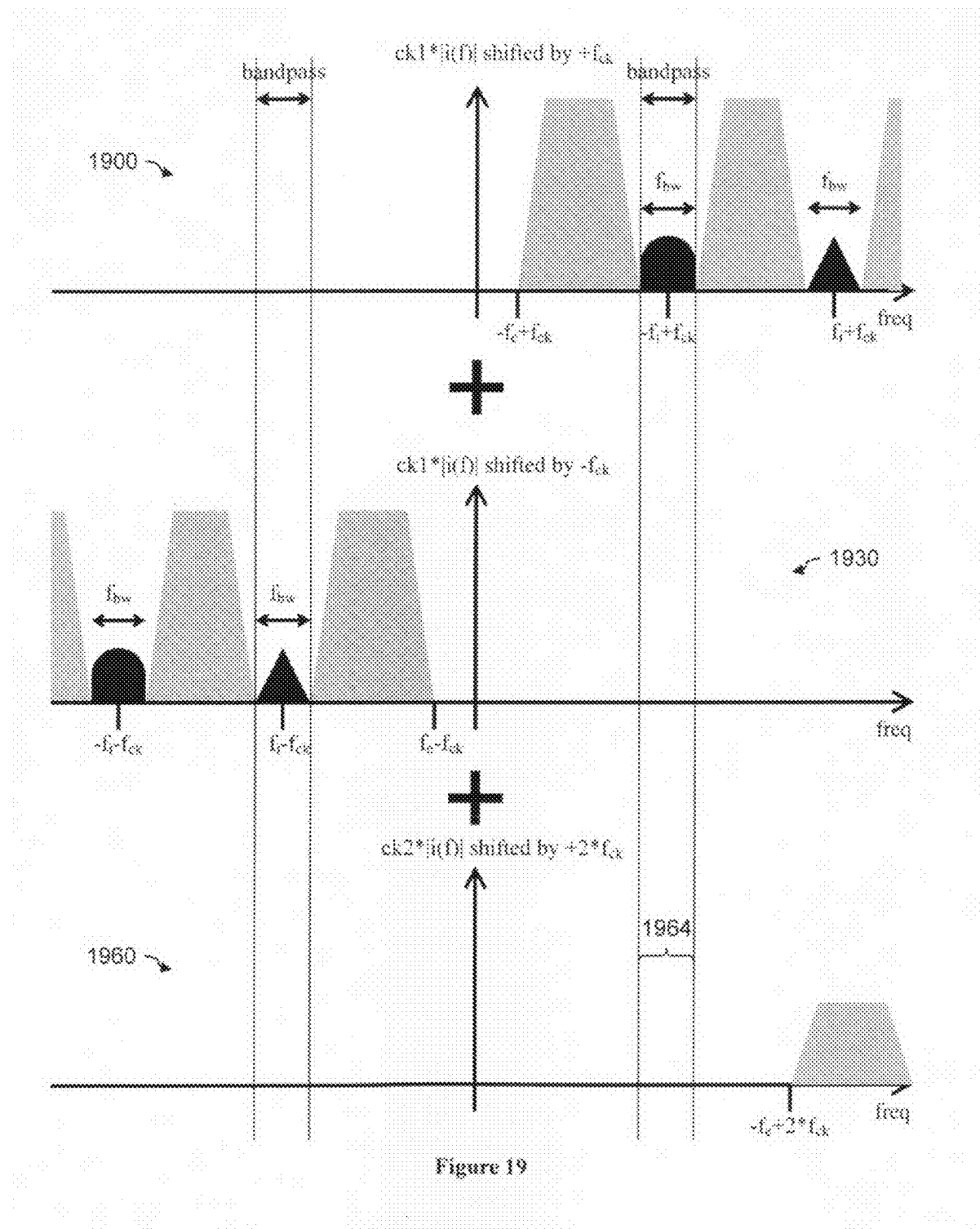
FIG. 19 is a diagram showing an embodiment of scaled and frequency shifted versions of an input frequency response for the clock tones $+f_{ck}$, $-f_{ck}$ and $+2*f_{ck}$ when $f_{ck}=|f_{bp}+f_i|$.

FIG. 19 is a diagram showing an embodiment of scaled and frequency shifted versions of an input frequency response for the clock tones $+f_{ck}$, $-f_{ck}$ and $+2*f_{ck}$ when $f_{ck}=|f_{bp}+f_i|$. In the example shown, the same frequency response summation elements shown in FIG. 18 are shown herein, except in FIG. 18 the clock frequency $f_{ck}$ is not set to $|f_{bp}+f_i|$. Diagram 1800 in FIG. 18 corresponds to diagram 1900 in FIG. 19, diagram 1830 in FIG. 18 corresponds to diagram 1930 in FIG. 19, and diagram 1860 in FIG. 18 corresponds to diagram 1960 in FIG. 19.

Figure 20:
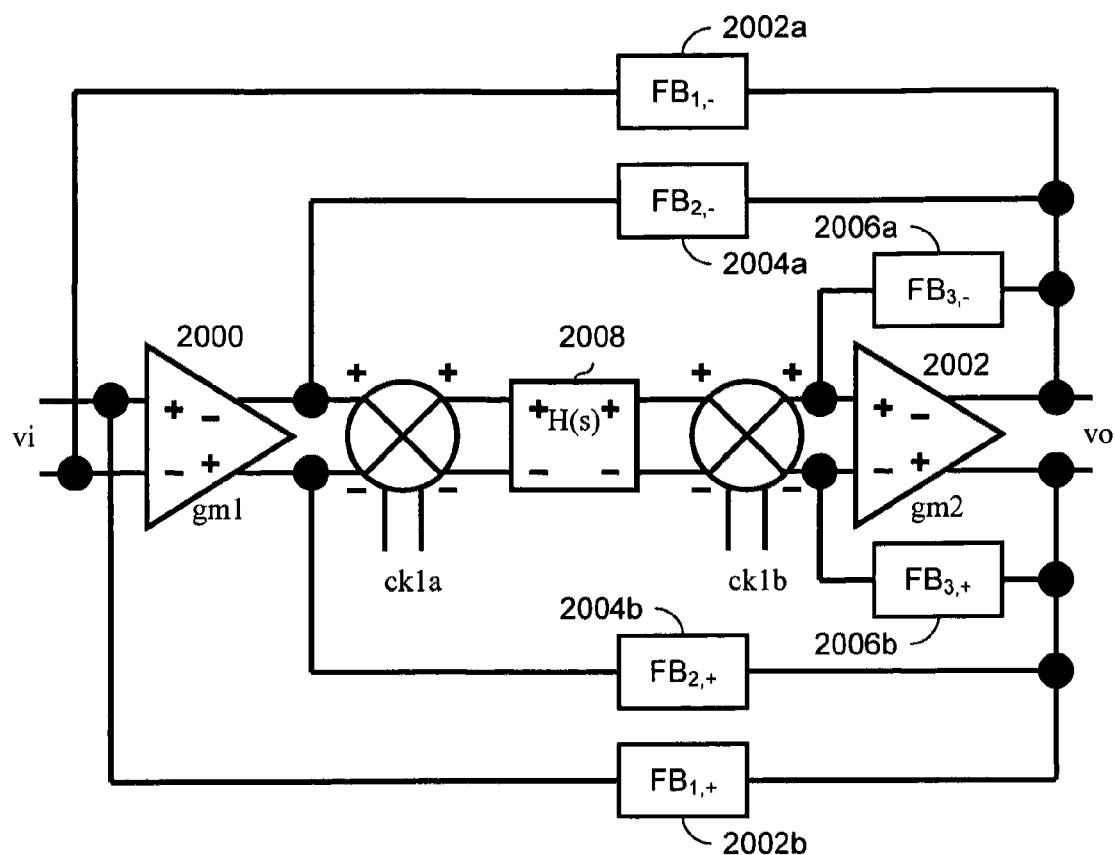
FIG. 20 shows an embodiment of how this image filtering approach may be used in conjunction with an amplifier configuration in order to achieve an amplifier with a programmable bandpass filter having the benefits of the image filtering approach.

As can be seen in diagram 1960 in FIG. 19, the $2*f_{ck}$ frequency response no longer has any blockers at or near $f_{bp}$ as was the case in FIG. 18. Specifically, in diagram 1960 there is no signal (desirable or undesirable) included in bandpass region 1964. This result also holds true for higher order harmonics. Furthermore, the $f_{bp}$ may be chosen so that $f_{bp}$ is high enough so that all the significantly large blockers at the input (in the frequency range $-f_e$ to $+f_e$) do not fall in the bandpass region when mixing with the second harmonic of the clock (i.e. $f_{bp}>f_e-2*f_{i\_min}+0.5*f_{bw}$). Here $f_{i\_min}$ signifies the minimum input signal frequency that the system will encounter. If the second harmonic of the clock is significantly lower in magnitude than the fundamental then the main cause for concern will be the third harmonic. In this case, the bandpass center frequency should be chosen to be: $f_{bp}>0.5*f_e-1.5*f_{i\_min}+0.25*f_{bw}$. The previously mentioned criteria will create a lower bound for the bandpass filter center frequency and the upper bound will be set by the designer so that the programmability and quality factor of the filter are maximized while allowing the signal integrity to be maintained as it passes from the mixer, through the bandpass filter and on to the following circuit blocks FIG. 20 shows an embodiment of how this image filtering approach may be used in conjunction with an amplifier configuration in order to achieve an amplifier with a programmable bandpass filter having the benefits of the image filtering approach. Some embodiments of such an amplifier are described above (see, e.g., FIGS. 6, 7A and 7B) and the image filtering approach shown in this figure is used to enhance the capabilities and broaden the usage of such an amplifier.

The amplifier architecture in FIG. 20 uses 2 transconductance elements: gm1 (2000) and gm2 (2002). These voltage-to-current converters in various embodiments can be formed from multi-transistor networks and may also include passive components such as resistors, capacitors and/or inductors. They may also be formed using feedback networks. Basically, any configuration that takes an AC voltage input and outputs an AC current. Feedback elements 2002, 2004, and 2006 are feedback elements and in some embodiments include resistive elements. In some embodiments, one or more of feedback elements 2002, 2004, and 2006 include any combination of passive components that form an impedance between two terminals. For example, the feedback elements shown in the figure could be replaced by elements $Z_1$, $Z_2$ and $Z_F$, respectively, to signify impedance elements. These impedances may also be programmable using switches to digitally program them or some analog voltage or current in conjunction with transistor elements to alter the impedance seen between the two terminals. Furthermore, $R_1$ or $Z_1$ may be removed altogether and the essence of the embodiment is maintained.

The signals ck1$a$ and ck1$b$ are input clocks that may be sinusoidal or square wave in nature and are both set to a frequency $f_{ck}=|f_{bp}+f_i|$ and may be in-phase or some fixed phase-shift apart from one another. H(s) (2008) is a bandpass filter in any form.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a clock generator configured to generate a clock signal having a frequency of $|f_{bp}+f_i|$;
a mixer configured to input (1) an input signal that includes a desired signal at the frequency $f_i$ and (2) the clock signal and generate a mixed signal using the input signal and the clock signal;
a filter, having a bandpass region that includes the frequency $f_{bp}$ that is higher in frequency than $f_i$, configured to input the mixed signal and generate a filtered signal based at least in part on the bandpass region; and
a controller configured to set $f_{bp}$ to be greater than $0.5*f_e-1.5*f_{i\_min}+0.25*f_{bw}$, wherein the input signal includes an undesired signal in the frequency range $-f_e$ to $+f_e$, $f_{i\_min}$ is a minimum input signal frequency, and $f_{bw}$ is the bandwidth of the bandpass region of the filter.

2. The system of claim 1, wherein:
the filter is programmable and the bandpass region, including the frequency $f_{bp}$, is able to be adjusted; and
the clock generator is programmable and is adjusted such that the clock signal generated has the frequency $|f_{bp}+f_i|$ based at least in part on the value that the frequency $f_{bp}$ is set to.

3. The system of claim 1, wherein:
the clock generator and the filter are adjustable; and
the adjustable clock generator, the mixer, and the adjustable filter are differential and each has a positive and a negative input and a positive and a negative output.

4. The system of claim 1, wherein the clock generator is a first clock generator, the mixer is a first mixer, and the system further includes:
a second clock generator configured to generate a second clock signal having a frequency of $|f_{bp}+f_i|$; and
a second mixer configured to input (1) the filtered signal and (2) the second clock signal and generate a second mixed signal using the filtered signal and the second clock signal.

5. A system, comprising:
a first clock generator configured to generate a clock signal having a frequency of $|f_{bp}+f_i|$;
a first mixer configured to input (1) an input signal that includes a desired signal at the frequency $f_i$ and (2) the clock signal and generate a mixed signal using the input signal and the clock signal;
a first filter, having a bandpass region that includes the frequency $f_{bp}$, configured to input the mixed signal and generate a filtered signal based at least in part on the bandpass region;
a second clock generator configured to generate a second clock signal having a frequency of $|f_{bp}+f_i|$;
a second mixer configured to input (1) the filtered signal and (2) the second clock signal and generate a second mixed signal using the filtered signal and the second clock signal;

a first transconductance element, wherein the output of the first transconductance element is coupled to the input of the first mixer;

a second transconductance element, wherein the input of the second transconductance element is coupled to the output of the second mixer;

a first feedback element, wherein a first connection of the first feedback element is coupled to the input of the first transconductance element and a second connection of the first feedback element is coupled to the output of the second transconductance element;

a second feedback element, wherein a first connection of the second feedback element is coupled to the output of the first transconductance element and a second connection of the second feedback element is coupled to the output of the second transconductance element; and a third feedback element, wherein a first connection of the third feedback element is coupled to the input of the second transconductance element and a second connection of the third feedback element is coupled to the output of the second transconductance element.

6. The system of claim 5, wherein:

the first and second transconductance elements and the first, second, and third feedback elements are differential and each has a positive and a negative input and a positive and a negative output;

the first feedback element includes a first negative feedback element, wherein a first connection of the first negative feedback element is coupled to the positive input of the first transconductance element and a second connection of the first negative feedback element is coupled to the positive output of the second transconductance element;

the first feedback element includes a second negative feedback element, wherein a first connection of the second negative feedback element is coupled to the negative input of the first transconductance element and a second connection of the second negative feedback element is coupled to the negative output of the second transconductance element;

the second feedback element includes a third negative feedback element, wherein a first connection of the third negative feedback element is coupled to the positive output of the first transconductance element and a second connection of the third negative feedback element is coupled to the positive output of the second transconductance element;

the second feedback element includes a fourth negative feedback element, wherein a first connection of the fourth negative feedback element is coupled to the negative output of the first transconductance element and a second connection of the fourth negative feedback element is coupled to the negative output of the second transconductance element;

the third feedback element includes a fifth negative feedback element, wherein a first connection of the fifth negative feedback element is coupled to the negative input of the second transconductance element and a second connection of the fifth negative feedback element is coupled to the positive output of the second transconductance element; and the third feedback element includes a sixth negative feedback element, wherein a first connection of the sixth negative feedback element is coupled to the positive input of the second transconductance element and a second connection of the sixth negative feedback element is coupled to the negative output of the second transconductance element.

7. The system of claim 5, wherein at least one of the first, second, or third feedback elements includes a resistor.

8. The system of claim 5, wherein at least one of the first, second, or third feedback elements includes a capacitor.

9. The system of claim 5, wherein at least one of the first, second, or third feedback elements includes an inductor.

10. The system of claim 5, wherein the frequency $f_{bp}$ is higher in frequency than $f_i$.

11. A method, comprising:

using a clock generator to generate a clock signal having a frequency of $|f_{bp}+f_i|$;

using a mixer to input (1) an input signal that includes a desired signal at the frequency $f_i$ and (2) the clock signal and generate a mixed signal using the input signal and the clock signal;

using a filter having a bandpass region that includes the frequency $f_{bp}$ that is higher in frequency than $f_i$ to filter the mixed signal in order to generate a filtered signal based at least in part on the bandpass region; and setting $f_{bp}$ to be greater than $0.5*f_e - 1.5*f_{i\_min} + 0.25*f_{bw}$, wherein the input signal includes an undesired signal in the frequency range $-f_e$ to $+f_e$, $f_{i\_min}$ is a minimum input signal frequency, and $f_{bw}$ is the bandwidth of the bandpass region of the filter.

12. The method of claim 11, wherein:

the filter is programmable and the bandpass region, including the frequency $f_{bp}$, is able to be adjusted; and the clock generator is programmable and is adjusted such that the clock signal generated has the frequency $|f_{bp}+f_i|$ based at least in part on the value that the frequency $f_{bp}$ is set to.

13. The method of claim 11, wherein:

the clock generator and the filter are adjustable; and the adjustable clock generator, the mixer, and the adjustable filter are differential and each has a positive and a negative input and a positive and a negative output.

14. The method of claim 11, wherein the clock generator is a first clock generator, the mixer is a first mixer, and the method further includes:

using a second clock generator to generate a second clock signal having a frequency of $|f_{bp}+f_i|$; and using a second mixer to input (1) the filtered signal and (2) the second clock signal and generate a second mixed signal using the filtered signal and the second clock signal.

15. A method, comprising:

using a first clock generator to generate a clock signal having a frequency of $|f_{bp}+f_i|$;

using a first mixer to input (1) an input signal that includes a desired signal at the frequency $f_i$ and (2) the clock signal and generate a mixed signal using the input signal and the clock signal;

using a first filter having a bandpass region that includes the frequency $f_{bp}$ to filter the mixed signal in order to generate a filtered signal based at least in part on the bandpass region;

using a second clock generator to generate a second clock signal having a frequency of $|f_{bp}+f_i|$; and using a second mixer to input (1) the filtered signal and (2) the second clock signal and generate a second mixed signal using the filtered signal and the second clock signal, wherein:

there is a first transconductance element, where the output of the first transconductance element is coupled to the input of the first mixer;

there is a second transconductance element, where the input of the second transconductance element is coupled to the output of the second mixer;

there is a first feedback element, where a first connection of the first feedback element is coupled to the input of the first transconductance element and a second connection of the first feedback element is coupled to the output of the second transconductance element;

there is a second feedback element, where a first connection of the second feedback element is coupled to the output of the first transconductance element and a second connection of the second feedback element is coupled to the output of the second transconductance element; and there is a third feedback element, where a first connection of the third feedback element is coupled to the input of the second transconductance element and a second connection of the third feedback element is coupled to the output of the second transconductance element.

16. The method of claim 15, wherein:

the first and second transconductance elements and the first, second, and third feedback elements are differential and each has a positive and a negative input and a positive and a negative output;

the first feedback element includes a first negative feedback element, wherein a first connection of the first negative feedback element is coupled to the positive input of the first transconductance element and a second connection of the first negative feedback element is coupled to the positive output of the second transconductance element;

the first feedback element includes a second negative feedback element, wherein a first connection of the second negative feedback element is coupled to the negative input of the first transconductance element and a second connection of the second negative feedback element is coupled to the negative output of the second transconductance element;

the second feedback element includes a third negative feedback element, wherein a first connection of the third negative feedback element is coupled to the positive output of the first transconductance element and a second connection of the third negative feedback element is coupled to the positive output of the second transconductance element;

the second feedback element includes a fourth negative feedback element, wherein a first connection of the fourth negative feedback element is coupled to the negative output of the first transconductance element and a second connection of the fourth negative feedback element is coupled to the negative output of the second transconductance element;

the third feedback element includes a fifth negative feedback element, wherein a first connection of the fifth negative feedback element is coupled to the negative input of the second transconductance element and a second connection of the fifth negative feedback element is coupled to the positive output of the second transconductance element; and the third feedback element includes a sixth negative feedback element, wherein a first connection of the sixth negative feedback element is coupled to the positive input of the second transconductance element and a second connection of the sixth negative feedback element is coupled to the negative output of the second transconductance element.

17. The method of claim 15, wherein at least one of the first, second, or third feedback elements includes a resistor.

18. The method of claim 15, wherein at least one of the first, second, or third feedback elements includes a capacitor.

19. The method of claim 15, wherein at least one of the first, second, or third feedback elements includes an inductor.

20. The method of claim 15, wherein the frequency $f_{bp}$ is higher in frequency than $f_i$.

* * * * *